(12) United States Patent
Uno et al.

(10) Patent No.: US 7,952,028 B2
(45) Date of Patent: May 31, 2011

(54) BONDING WIRE FOR SEMICONDUCTOR DEVICE

(75) Inventors: Tomohiro Uno, Tokyo (JP); Keiichi Kimura, Tokyo (JP); Takashi Yamada, Iruma (JP)

(73) Assignees: Nippon Steel Materials Co., Ltd., Tokyo (JP); Nippon Micrometal Corporation, Iruma (JP)

( * ) Notice: Subject to any disclaimer, the term of this patent is extended or adjusted under 35 U.S.C. 154(b) by 0 days.

(21) Appl. No.: 12/747,434

(22) PCT Filed: Jan. 20, 2009

(86) PCT No.: PCT/JP2009/050712
§ 371 (c)(1),
(2), (4) Date: Jun. 10, 2010

(87) PCT Pub. No.: WO2009/093554
PCT Pub. Date: Jul. 30, 2009

(65) Prior Publication Data
US 2010/0282495 A1    Nov. 11, 2010

(30) Foreign Application Priority Data
Jan. 25, 2008    (JP) .................... 2008-015262

(51) Int. Cl.
H01R 4/62    (2006.01)
(52) U.S. Cl. .................... 174/94 R; 174/126.2
(58) Field of Classification Search ............... 174/74 R, 174/84 R, 94 R, 102 R, 103, 108, 109, 126.1, 174/126.2
See application file for complete search history.

(56) References Cited

U.S. PATENT DOCUMENTS

| | | | |
|---|---|---|---|
| 5,396,104 A * | 3/1995 | Kimura | 257/784 |
| 6,140,583 A | 10/2000 | Suzuki et al. | |
| 7,820,913 B2 * | 10/2010 | Uno et al. | 174/94 R |

(Continued)

FOREIGN PATENT DOCUMENTS

EP    0 722 198    7/1996
(Continued)

OTHER PUBLICATIONS

Extended European Search Report dated Feb. 1, 2011 for EP application No. 09703155, based on PCT/JP2009/050712, and which is the European counterpart of the instant U.S. Appl. No. 12/747,434.

(Continued)

*Primary Examiner* — William H Mayo, III
(74) *Attorney, Agent, or Firm* — McDermott Will & Emery LLP

(57) ABSTRACT

A high-performance bonding wire that is suitable for semiconductor mounting technology, such as stacked chip bonding, thinning, and fine pitch mounting, where wire lean (leaning) at an upright position of a ball and spring failure can be suppressed and loop linearity and loop height stability are excellent. This bonding wire for a semiconductor device includes a core material made of a conductive metal, and a skin layer formed on the core material and containing a metal different from the core material as a main component; wherein a relationship between an average size (a) of crystal grains in the skin layer on a wire surface along a wire circumferential direction and an average size (b) of crystal grains in the core material on a normal cross section, the normal cross section being a cross section normal to a wire axis, satisfies an inequality of $a/b \leqq 0.7$.

11 Claims, 2 Drawing Sheets

U.S. PATENT DOCUMENTS

2003/0168968 A1    9/2003   Sotani et al.
2004/0014266 A1*   1/2004   Uno et al. .................... 438/200

FOREIGN PATENT DOCUMENTS

| | | |
|---|---|---|
| EP | 2 200 076 | 6/2010 |
| JP | 62-097360 A | 5/1987 |
| JP | 04-079236 A | 3/1992 |
| JP | 04-079240 A | 3/1992 |
| JP | 04-079242 A | 3/1992 |
| JP | 2004-006740 | 1/2004 |
| JP | 2004-031469 A | 1/2004 |
| JP | 2004-064033 A | 2/2004 |
| JP | 2004-228541 A | 8/2004 |
| JP | 2005-268771 A | 9/2005 |
| JP | 2006-32934 A | 2/2006 |
| JP | 2006-100777 | 4/2006 |
| JP | 2006-190763 A | 7/2006 |
| JP | 2007-012776 A | 1/2007 |
| JP | 2008-226501 | 9/2008 |

OTHER PUBLICATIONS

Shingo Kaimori, Tsuyoshi Nonaka and Akira Mizoguchi: "Development of 'Hybrid Bonding Wire' ", SEI Technical Review Journal, No. 63, Dec. 2006, pp. 14-18.

Seiichi Suzuki: "Fundamental Principle of EBSP Method and Benefit of Recent Transition to Nanobeam", *Materia Japan*, vol. 7, No. 40, pp. 612-616 (2001).

J.J.L. Mulders et al., "3D-EBSD Analysis for Au Bonding Wire Using a Fully Automated Dual-Beam FIB-SEM-EBSP System", *Kenbikyou (Microscope)*; vol. 41, No. 3, pp. 204-207 (2006).

Tohru Watanabe: Fine Plating (Version II); "Structure and Property Control Theory of Plating Film, New Proposed Theory of Metal Corrosion, and Database of Structure of Plating Film", 1st printing (Aug. 15, 2007), published by the Nanoplating Laboratory, Tokyo Metropolitan University.

\* cited by examiner

BONDING WIRE FOR SEMICONDUCTOR DEVICE

CROSS REFERENCE TO PRIOR APPLICATIONS

This application is a U.S. National Phase application under 35 U.S.C. §371 of International Application No. PCT/JP2009/050712, filed on Jan. 20, 2009 and claims benefit of priority to Japanese Patent Application No. 2008-015262, filed on Jan. 25, 2008. The International Application was published in Japanese on Jul. 30, 2009 as WO 2009/093554 under PCT Article 21(2). All these applications are herein incorporated by reference.

TECHNICAL FIELD

The present invention relates to a bonding wire for a semiconductor device to be used for connection between an electrode on a semiconductor element and a wiring line of a circuit wiring substrate (e.g., a lead frame, a substrate, a tape, and so on).

BACKGROUND ART

At present, thin wires (bonding wires) having a diameter of approximately 20 to 50 μm are being mainly used as bonding wires for connection between the electrodes on a semiconductor element and external terminals. To bond a bonding wire, thermocompression bonding with the aid of ultrasound is commonly used, where a general-purpose bonding apparatus, a capillary jig into which a bonding wire is inserted for connection, or the like, is used. The tip of a bonding wire is heated and melted by arc heat input, thereby forming a ball by surface tension. Then the ball portion thus formed is compressively bonded onto an electrode of a semiconductor element that has been heated in a range of 150 to 300° C., and thereafter, the connected wire is directly bonded to the outer lead side by ultrasonic compression bonding.

Recently, the technologies relating to the structure, material, and connection for semiconductor device mounting have diversified rapidly. For example, regarding the mounting structure, in addition to current QFP (Quad Flat Packaging) using a lead frame, new types, such as BGA (Ball Grid Array) using a substrate, a polyimide tape, or the like, and CSP (Chip Scale Packaging) have been practically used. For this reason, a bonding wire having improvements in loop characteristic, bondability, mass production usability, and the like has been demanded.

Introduction of a fine pitch technique where a space between adjacent bonding wires becomes narrow has progressed. In response to the introduction of the fine pitch technique, thinning, improvement of strength, loop controllability, and bonding property have become requisite for bonding wires. Loop shape has become complex due to the density growth in the semiconductor packaging technologies. Loop height and wire length (span) of a bonding wire are barometers for classification of the loop shape. In most-recent semiconductor devices, contradictory loop shapes, such as a high loop and a low loop, and, a short span and a long span, are increasingly mixed within the interior of a single package. In order to realize such contradictory loop shapes with a bonding wire of one kind, strict designing of the material of the bonding wire is essential.

As the material for a bonding wire, high-purity 4N-group gold (purity>99.99% by mass) has been mainly used so far. To improve the properties, such as for strength enhancement, higher bonding, or the like, adjustment of a trace amount of an alloying element or elements has been performed. Recently, for the purpose of increasing the reliability of a bonded portion or the like, a 2N-purity gold alloy wire (purity>99% by mass) is in practical use, in which the concentration of an additive element is increased up to 1% by mass. Enhancement of strength, control of reliability, and the like can be achieved by adjusting the kind and concentration of the alloying element added to gold. On the other hand, bad influences, such as bondability degradation and increase in electrical resistance may occur due to such alloying, and therefore, it is difficult to comprehensively satisfy the various properties required for a bonding wire.

Moreover, because gold is expensive, another kind of metal whose material cost is lower is demanded, and thus, a copper-based bonding wire which is low in material cost and is excellent in electrical conductivity has been developed. With a bonding wire made of copper, however, there are problems in that bonding strength is lowered due to oxidation of the bonding wire surface, and wire surface corrosion or the like is likely to occur when encapsulated with a resin. These are the reasons why practical use of a copper bonding wire has not progressed.

All the bonding wires that have been used practically so far have the feature of a monolayer structure. Even if the material has been changed to gold, copper, or the like, these wires contain an alloying element distributed uniformly, and when they are seen in cross section, they are monolayer-structured. Although a thin native oxide film, an organic film for surface protection, or the like may be formed on the wire surface, these are limited within an extremely thin region (at a level of several atomic layers) of the outermost surface.

To meet the various needs for a bonding wire, a bonding wire having a multilayer structure where the bonding wire surface is coated with another metal has been proposed.

As a method of preventing surface oxidation of a copper bonding wire, Patent Literature 1 discloses a bonding wire where copper is covered with a noble metal or a corrosion-resistant metal, such as gold, silver, platinum, palladium, nickel, cobalt, chrome, or titanium. Moreover, from the standpoint of ball formability, prevention of deterioration of the plating solution or the like, Patent Literature 2 discloses a bonding wire structured to have a core material mainly composed of copper, a dissimilar metal layer formed on the core material and made of a metal other than copper, and a coating layer formed on the dissimilar metal layer and made of an oxidation-resistant metal having a higher melting point than copper. Patent Literature 3 discloses a bonding wire comprising a core material mainly composed of copper, and a skin layer formed on the core material and containing copper and a metal whose component or composition or both is/are different from the core material, where the skin layer is a thin film with a thickness of 0.001 to 0.02 μm.

Moreover, many multilayer structures have been proposed for a gold bonding wire also. For example, Patent Literature 4 discloses a bonding wire comprising a core material composed of high-purity Au or Au alloy, and a coating material coated on the outer surface of the core material and composed of high-purity Pd or Pd alloy. Patent Literature 5 discloses a bonding wire comprising a core material composed of high-purity Au or Au alloy, and a coating material coated on the outer surface of the core material and composed of high-purity Pt or Pt alloy. Patent Literature 6 discloses a bonding wire comprising a core material composed of high-purity Au or Au alloy, and a coating material coated on the outer surface of the core material and composed of high-purity Ag or Ag alloy.

These multilayer-structured bonding wires for a semiconductor device have not been used in practice so far although great expectation for practical use has been held. Surface reforming, high value-addition, and the like are expected by employing the multilayer structure. On the other hand, productivity and quality in wire production, yield and performance stability in the bonding process, long-term reliability during the use of a semiconductor device, and the like must be satisfied comprehensively.

Regarding the properties of a wire used for mass production, it is desired to cope with the most advanced high-density mounting, such as fine pitch bonding, stacked chip bonding, and the like by totally satisfying such required properties as stable loop control and improved bondability in the bonding process, wire deformation suppression in the resin encapsulation process, long-term reliability of a bonded portion, and so on.

Patent Literature 1: Unexamined Japanese Patent Publication No. S62-97360
Patent Literature 2: Unexamined Japanese Patent Publication No. 2004-64033
Patent Literature 3: Unexamined Japanese Patent Publication No. 2007-12776
Patent Literature 4: Unexamined Japanese Patent Publication No. H4-79236
Patent Literature 5: Unexamined Japanese Patent Publication No. H4-79240
Patent Literature 6 Unexamined Japanese Patent Publication No. H4-79242

DISCLOSURE OF THE INVENTION

Problems to be Solved by the Invention

With the conventional bonding wires having a monolayer structure (which will be termed "monolayer wires" hereinafter), to improve tensile strength, bonded portion strength, reliability, and the like, doping of an alloying metal is effective. However, there is concern that enhancement of the properties is limited. With a bonding wire having a multilayer structure (which will be termed a "multilayer wire" hereinafter), it is expected to raise the added values by making the properties superior to a monolayer wire. As a multilayer wire that brings higher functions, for example, to prevent surface oxidation of a copper bonding wire, a noble metal or a corrosion-resistant metal can be coated on the wire surface. Regarding a gold bonding wire also, an effect of reducing the resin flow is expected by coating a high-strength metal or alloy on the wire surface.

However, according to the evaluation of the inventors, in consideration of the needs for densification, miniaturization, thinning, and the like in semiconductor device mounting, it was found that many practical problems were left for a multilayer wire as described later.

Because of pin count increase and pitch narrowing, wire connections whose wire length and/or loop height are different from each other are mixed in one IC. Problems that have been unknown before often occur. As a typical example, leaning failure at the upright portion of a ball is a new problem recognized in response to pitch narrowing. Leaning failure is a phenomenon where the upright portion of a wire in the vicinity of a ball bonded portion leans, resulting in a narrowed interval between adjacent wires. A wire material that improves leaning failure is in demand.

As a measure against leaning failure at the upright portion of a ball, even if the strength and elastic modulus of a bonding wire are simply made higher, and contrarily, the strength of a bonding wire is simply made lower, improvements are difficult. In addition, even if, only the mechanical properties, such as fracture growth and elastic modulus are increased or decreased, it is difficult to stably reduce leaning failure. Because the upright portion of a ball is subject to thermal effects during ball melting, and deformation strains during loop formation, simple extension of the conventional materials based on the mechanical properties of the wire base part, or alloy designing by element doping has a limitation. To suppress leaning failure, being leaning of a bonding wire, is one of the important problems in fine pitch bonding in the mass production stage. With a multilayer wire, since material design and texture control needs to be performed for the core material and the skin layer separately, it is said that the leaning problem is difficult to be improved, where their dominant factors are not clear.

Next, spring failure that becomes a problem in stacked chip bonding will be explained below. In wire bonding for stacked chips, bonding which is termed reverse bonding where the bonding positions are reversed with respect to ordinary wire bonding is often used. This is a method where a stud bump is formed on an electrode on a chip in the first step, and a ball portion is bonded to an electrode on a substrate and a bonding wire is wedge-bonded onto the stud bump in the second step. By the use of this reverse bonding, loop height can be made low, and stable loop control can be performed even if the level difference is considerably large due to an increase of the chip stacking number. On the other hand, there is concern that spring failure where a bonding wire is bent, occurs in this reverse bonding. Stacked chips are in the main stream of memory ICs, and a reduction of such spring failure is to be expected.

As a method for reducing spring failure, a method of lowering the breaking strength of a bonding wire is employed. However, wire thinning by lowering the breaking strength has a limit, and there is concern that the loop shape becomes unstable. It is difficult to realize spring failure reduction and loop shape stabilization simultaneously. With a multilayer wire, since material selection, alloying, and texture control needs to be performed for the core material and the skin layer separately, then even if improvement is examined for spring failure and loop shape separately, it is considered that both of these properties are difficult to be satisfied simultaneously.

With the present invention, it is an object to provide a multilayer wire that solves the aforementioned problems of the prior art, in particular, a bonding wire for a semiconductor device that makes it possible to reduce leaning failure and spring failure.

Means for Solving Problems

To solve the problems, such as leaning failure, spring failure, and the like of the aforementioned bonding wire, the inventors of the present invention examined a multilayer-structured bonding wire and as a result, have found it effective to control the crystal grain texture of the skin layer and the crystal grain texture of the core material.

The present invention was made on the basis of the to aforementioned finding and has the following content.

A bonding wire of the present invention according to a first aspect is a bonding wire for a semiconductor device comprising a core material made of a conductive metal, and a skin layer formed on the core material and containing a metal different from the core material as a main component; wherein a relationship between an average size (a) of crystal grains in the skin layer on a wire surface along a wire circumferential direction and an average size (b) of crystal grains in the core material on a normal cross section, said normal cross section being a cross section normal to a wire axis, satisfies an inequality of a/b≦0.7.

In a bonding wire of the present invention according to a second aspect, the average size (a) is 1.5 μm or less in the first aspect.

In a bonding wire of the present invention according to a third aspect, the average size (b) is 2 μm or more in the first or second aspect.

In a bonding wire of the present invention according to a fourth aspect, a relationship between an average size (c) of the crystal grains in the skin layer on the wire surface along a wire axis direction and an average size (d) of the crystal grains in the core material along the wire axis direction on an axial cross section, said axial cross section being a cross section that includes the wire axis along a longitudinal direction, satisfies an inequality of d/c≧1.2 in any one of the first and three aspects.

In a bonding wire of the present invention according to a fifth aspect, a relationship between a hardness SH on a surface of the skin layer and a hardness CH on a cross section of the core material satisfies an inequality of SH/CH≧1.3 in any one of the first to fourth aspects.

In a bonding wire of the present invention according to a sixth aspect, the skin layer has a thickness of 0.005 to 0.3 μm in any one of the first to fifth aspects.

In a bonding wire of the present invention according to a seventh aspect, the main component constituting the skin layer is at least one of Pd, Pt, Ru, and Ag in any one of the first to sixth aspects.

In a bonding wire of the present invention according to an eighth aspect, a main component constituting the core material is at least one of Cu and Au in any one of the first to seventh aspects.

In a bonding wire of the present invention according to a ninth aspect, an intermediate metal layer made of a component different from the main components constituting the skin layer and the core material is provided between the skin layer and the core material in any one of the first to eighth aspects.

In a bonding wire of the present invention according to a tenth aspect, a diffusion layer having a concentration gradient is provided between the skin layer and the core material in any one of the first to ninth aspects.

In a bonding wire of the present invention according to an eleventh aspect, the main component constituting the core material is Cu, and the core material contains at least one of In, Ca, B, Pd, Bi, Zr, Ag, and P in a range of 5 to 300 ppm in any one of the seventh to tenth aspects.

In a bonding wire of the present invention according to a twelfth aspect, the main component constituting the core material is Cu, the core material contains Pd in a range of 5 to 10000 ppm, and the main component constituting the skin layer is Pd or Ag in any one of the seventh to eleventh aspects.

In a bonding wire of the present invention according to a thirteenth aspect, the main component constituting the core material is Au, and the core material contains at least one of Be, Ca, Ni, Pd, and Pt in a range of 5 to 9500 ppm in any one of the seventh to tenth aspects.

Effects of the Invention

With the bonding wire for a semiconductor device according to the present invention, wire leaning at the upright portion of a ball (leaning failure) can be improved. Moreover, spring failure which becomes a problem in stacked chip bonding or the like can be suppressed. Loop linearity and loop height stability can be enhanced. Bonding shape stabilization of a bonding wire can be accelerated. As a result, a high-performance bonding wire that copes with the latest semiconductor mounting technologies, such as thinning, pitch narrowing, span extension, three-dimensional mounting, and the like can be provided.

BRIEF DESCRIPTION OF THE DRAWINGS

FIGS. 2(a), 2(b) and 2(c) show the structure and cross section of the wire; wherein FIG. 2(a) shows the wire structure, FIG. 2(b) shows the cross section normal to the wire axis (normal cross section), and FIG. 2(c) shows the cross section along the longitudinal direction of the wire (axial cross section).

BEST MODE FOR CARRYING OUT THE INVENTION

Figure 1:
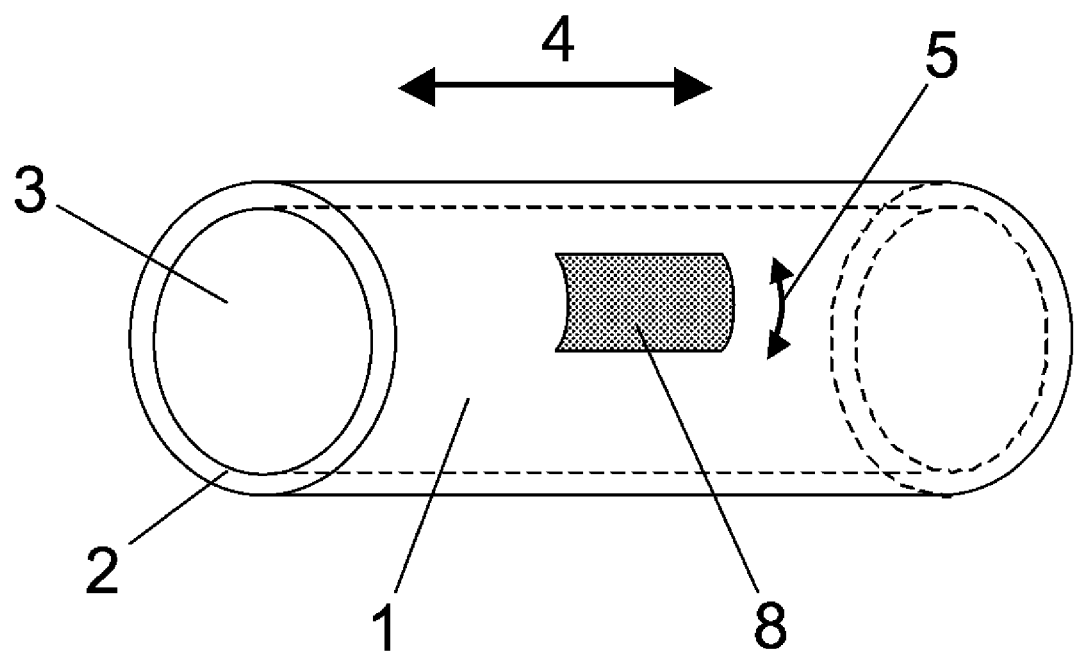
FIG. 1 shows an observation area of the wire surface.

A bonding wire for a semiconductor device (which will be termed a "bonding wire" hereinafter) structured to have a core material made of a conductive metal, and a skin layer formed on the core material and containing a face-centered cubic metal different from the core material as a main component was examined. As a result, it was found that controlling the crystal grain texture of the skin layer and the crystal grain texture of the core material in such a manner as to have a specific relationship is effective in improving wire leaning at the upright portion of a ball (leaning failure) and in suppressing spring failure in reverse bonding, in addition to enhancing the wedge bonding strength.

Concretely speaking, a multilayer-structured bonding wire that copes with new needs, such as fine pitch bonding, and three-dimensional bonding was examined and as a result, it was found that controlling the textures of the skin layer and the core material was mutually effective. In particular, by paying attention to the effect that is given to the performance in the use of wire bonding by the relationship between the crystal grain size on the surface of the skin layer and the crystal grain size on the cross section of the core material, it was first confirmed that loop control, bondability, and the like were able to be improved comprehensively. More effectively, it was found that controlling the combination of the material quality, thickness, and the like of the skin layer and the core material is effective.

Namely, in a bonding wire for a semiconductor device comprising a core material made of a conductive metal, and a skin layer formed on the core material and containing a metal different from the core material as a main component; a relationship between an average size (a) of crystal grains in the skin layer on a wire surface along a wire circumferential direction and an average size (b) of crystal grains in the core material on a normal cross section, said normal cross section being a cross section normal to a wire axis, satisfies an inequality of a/b≦0.7. With this multilayer wire, leaning failure can be improved.

The factor that controls the leaning has not been clarified yet and therefore, wire material development based on new indices is necessary. Leaning phenomenon (failure) is leaning of a wire at an upright portion in the vicinity of a ball joint. Accordingly, it may be said that the leaning phenomenon is wire linearity in the vicinity of the upright portion of a ball joint or in a portion which is affected by heat during ball bonding (a thermally affected portion). To maintain the linearity of this portion to control the loop shape, it is effective to control the texture of the surface of a bonding wire separately and the texture of the central part thereof. With a multilayer wire, controlling the skin layer and the core material separately becomes comparatively easy and therefore, it is advantageous at this point.

It was found that simultaneously controlling the decrease in crystal grain size in the skin layer of a multilayer wire, and oppositely, the increase in crystal grain size in the core material thereof, is effective in improvement of the leaning (leaning failure suppression and wire linearity in the thermally affected portion or the like). It is expected that deformation resistance in the complicated loop control is reduced by the increase of the crystal grain size in the core material, resulting in a stabilizing effect of the loop. Moreover, it is expected that the surface texture of the thermally affected portion is allowed to become fine by the decrease of the crystal grain size in the skin layer, resulting in an effect of maintaining the linearity. Even if the bonding wire in the neighborhood of a ball is thermally affected by heat, and thus, the crystal grains in the core part are made coarse due to recrystallization, the minute texture in the skin layer can be maintained to a certain extent. It is considered that this gives an effective action to the suppression of lateral leaning in spite of the existence of considerable deformation strain caused by curvature, flexure, and so on. It was confirmed that the effect of improving the leaning was small even if only one of; making the skin layer finer, and making the core material coarser is carried out.

Concretely speaking, it was found that when the average size (a) of crystal grains in the skin layer on the wire surface along the wire circumferential direction, and the average size (b) of crystal grains in the core material on the normal cross section which is a cross section normal to the wire axis were used, the ratio of a/b was correlated with the leaning phenomenon most strongly. The facts that; the texture along the circumferential direction of the wire axis and the texture on the normal cross section were more dominant in the leaning phenomenon where the bonding wire leans laterally; observation from the surface of the thin skin layer enabled correct judgments about the texture in the skin layer more accurately; and so forth, were considered therein comprehensively. Here, the reason why the ratio of the average crystal grain size of the skin layer to that of the core material, a/b, is 0.7 or less is because of the enhanced effect of suppressing the leaning failure. Preferably, if the ratio of a/b is 0.3 or less, then a high effect of reducing the leaning failure is obtained even in the case of high loop bonding where the loop height is 400 µm or greater. Because the leaning failure has a close relationship with the wire leaning, the failure rate usually has a tendency to increase with the loop height. It is advantageous in multistage wiring and the like that the leaning property is improved even in the case where the loop height is 400 µm or greater. More preferably, if the ratio of a/b is 0.1 or less, the effect of suppressing the leaning failure for thin wires having a diameter of 20 µm or less is enhanced, which is suitable for fine pitch bonding of 40 µm or less. In addition, there is a tendency that the smaller the value of a/b, the more advantageous the leaning failure suppression. However, if the productivity, operability, quality assurance, and the like for wire production are also taken into consideration, it is preferred that the lower limit value thereof is 0.001 realistically.

A multilayer-structured bonding wire comprising the core material and the skin layer satisfies the crystal grain size ratio of a/b≦0.7, and more preferably, the aforementioned average size (a) of the crystal grains in the skin layer is 1.5 µm or less. Owing to this, leaning failure occurring in different-level reverse bonding, which has been recognized as a difficult problem to cope with, is improved, thereby accelerating the mass production and practical use of stacked chip bonding.

With different-level reverse bonding, a wedge bonded portion is usually located at a higher position than a ball bonded portion. Therefore, the length of an upright portion of the wire near the ball joint is several times as much as that of ordinary bonding, and the position where plastic deformation occurs is different. This is the factor that raises the occurrence frequency of failures, such as wire leaning and curving, in different-level reverse bonding. The causes of these failures are similar to the cause of the aforementioned leaning phenomenon, where evaluation is carried out more strictly.

Here, the reason why the average crystal grain size (a) of the skin layer along the circumferential direction is 1.5 µm or less is that if it is greater than 1.5 µm, there is a case where the leaning failure is difficult to be reduced in different-level reverse bonding. More preferably, the said average crystal grain size (a) is 1 µm or less. If the size (a) is in this range, a high effect where the leaning failure is suppressed in different-level reverse bonding using a thin wire having a diameter of 20 µm or less is obtained. As described above, it is preferred that the average crystal grain size of the skin layer is smaller. However, it is realistic that the lower limit value of this average crystal grain size is 0.001 µm or greater because of the limitation in production by the current technologies.

A multilayer-structured bonding wire comprising the core material and the skin layer satisfies the aforementioned crystal grain size ratio of a/b≦0.7, and more preferably, the aforementioned average size (b) of the crystal grain size in the core material is 2 µm or greater. By this, damage at the neck portion is reduced, which is advantageous for loop lowering. In low loop bonding, since a stretching operation is forcibly applied to a bonding wire, the neck portion where the strength is weak is likely to suffer damage, such as cracking or damages to aperture shape due to the influence of heat. If the average crystal grain size (b) of the core material is enlarged, the crystal grain boundary can be decreased also. As a result, it is considered that the damage at the neck portion is prevented by improvement of ductility of the individual crystal grains, reduction of residual strain, or the like. As describe above, it is preferred that the average crystal grain size of the core material is larger. However, the upper limit thereof is equal to the diameter of the core material or less. Moreover, it is preferred to be 15 µm or less in view of the economical time taken for grain growth in the production process.

Here, the reason why the average crystal grain size (b) of the core material on its cross section is 2 µm or greater is that if it is less than 2 µm, there is a case where the effect of reducing the neck damage in low loop bonding is not obtained sufficiently. More preferably, the average crystal grain size (b) is 4 µm or greater. If the size (b) is in this range, a higher effect where the neck damage is suppressed in ultralow loop bonding where the loop height is 70 µm or less is obtained.

A multilayer-structured bonding wire comprising the core material and the skin layer satisfies the aforementioned crystal grain size ratio of a/b≦0.7. More preferably, a relationship between the average size (c) of the crystal grains in the skin layer on the wire surface along the wire axis direction and the average size (d) of the crystal grains in the core material along the wire axis direction on the axial cross section, said axial cross section being a cross section including the wire axis along the longitudinal direction, satisfies an inequality of d/c≧1.2. By this, leaning failure suppression and linearity improvement of the loop shape (loop shape stabilization) can be performed and moreover, spring failure can be reduced. Spring failure reduction and loop shape stabilization are realized simultaneously and thus, it is advantageous for stacked chip bonding. The effects of the aforementioned average sizes (c) and (d) have a complex relationship with each other.

However, if their main effects are assumed separately, an effect is obtained where the fracture elongation of the wire in tail cutting after wedge bonding is increased to thereby reduce the spring failure, by increasing the average size (d) of the crystal grains in the core material along the wire axis direction. On the other hand, by decreasing the average size (c) of the crystal grains in the skin layer along the wire axis direction, it is considered that an effect of improving the loop shape linearity is also implemented in addition to the effect that the fracture shape in tail cutting is stabilized to lower the spring property. To sort out these comprehensive effects, the ratio of d/c between the average crystal grain sizes in the skin layer and the core material along the wire axis is most effective.

Here, the reason why the said ratio of d/c is 1.2 or greater is that if d/c is less than 1.2, there is a case where the effect of suppressing the spring failure and improving the loop linearity simultaneously is not obtained sufficiently. More preferably, if the said ratio d/c is equal to 2 or greater, a high effect of suppressing the spring failure even if a thin wire with a diameter of 20 μm or less is used is obtained.

A multilayer-structured bonding wire comprising the core material and the skin layer satisfies the aforementioned crystal grain size ratio of a/b≦0.7, and more preferably, a relationship between the hardness SH on the surface of the skin layer and the hardness CH on the cross section of the core material satisfies the inequality of SH/CH≧1.3. By this, leaning failure suppression and loop-height dispersion reduction (loop shape stabilization) can be realized and moreover, the wedge bondability can be improved. In other words, the wedge bondability and the loop shape stability can be realized simultaneously.

With a multilayer wire, formerly, it has been usual that the wedge bondability and the loop stability are in a trade-off relationship and they are difficult to be satisfied simultaneously. By using a new index of the hardness ratio SH/CH, a multilayer wire that simultaneously improves the wedge bondability and the loop stability, with mutual contradiction can be designed. The effects by the aforementioned hardness SH and CH have a complicated relationship with each other. However, their main effects are assumed separately. If the hardness CH of the core material is lower, the said material is softer and thus, it is considered that the bonding area in wedge bonding is increased and the bondability is raised. Moreover, if the hardness SH of the skin layer is high, it is considered that an oxide film, a contaminated layer, and the like formed on the surface are broken while a bonding target to be bonded is deformed, resulting in an effect of enhancing the bonding strength. Regarding the loop height, if SH is higher, the surface is harder and if CH is lower, the core material is softer. Thus, the deformation resistance during loop formation has a tendency to decrease. Therefore, raising the hardness ratio SH/CH is advantageous for operating a high-speed complicated loop control.

More preferably, if the said ratio SH/CH is 2 or greater, a high effect of realizing simultaneously the wedge bondability improvement and the loop-height dispersion reduction is obtained. In particular, a high effect of improving both of these two properties is obtained when a thin wire with a diameter of 20 or less is used. The upper limit of the hardness ratio SH/CH is not set specifically from the view point of the performance in use. However, it is 50 or less realistically in consideration of the wire production processes. Regarding the measuring method, a hardness measuring method for a minute region by the micro Vicker's hardness or a nano-indenter apparatus may be employed. The hardness measuring methods may be chosen according to the measuring position, the quality of material, and so on. For example, the micro Vicker's hardness measurement is effective for measuring the cross section of the core material, and the nano-indenter hardness measurement is effective for measuring the wire surface of the skin layer. With the micro Vicker's hardness measurement, the load is adjusted in the range of 0.09807 to 9.807 N according to the hardness. With the nano-indenter hardness measurement, the load of 0 mN to 20 mN is imposed to measure the function between the load and depth, thereby obtaining the hardness.

The conductive metal contained in the skin layer as its main component, which is a metal different from the conductive metal contained in the core material as its main component, is preferably a metal which has an effect of improving the bondability of a bonding wire and which is effective in preventing the oxidation of the bonding wire. Concretely speaking, Pd, Pt, Ru, Rh, or Ag is a candidate. Moreover, if it is considered that practical utility and cost performance are important, it is preferred that at least one of Pd, Pt, Ru, and Ag is used. Here, the main component means an element whose concentration is equal to 50 mol % or greater. Pd has an advantage in that its adhesion property to an encapsulating resin and bondability to an electrode are sufficient, and that quality control is easy. Pt is comparatively easy in ball shape stabilization. Ru is hard and easy to form a dense film, and its material cost is comparatively inexpensive. Rh is good in performance, such as oxidation resistance. However, the material cost is high and therefore, future investigation such as film thinning is expected. Since Ag is soft, blemishes can be suppressed comparatively easier when a wiredrawing process is applied to a wire on which a skin layer has been formed, and the material cost is low. Therefore, Ag is useful for cost-oriented semiconductor devices.

Namely, it is preferred that the skin layer is made of a pure metal containing at least one of Pd, Pt, Ru, and Ag as its main component, or an alloy containing the aforementioned conductive metal as its main component. In the case of a pure metal, there is an advantage in that oxidation resistance, bondability, and the like are easily improved. In the case of an alloy, there is an advantage in that wire deformation during resin encapsulation is suppressed due to an increase in tensile strength and elastic modulus. Here, the aforementioned pure metal corresponds to one in which part of the skin layer includes a sublayer having a concentration of 99 mol % or greater, or the skin layer excluding the diffusion layer has an average concentration of 80 mol % or greater. The aforementioned alloy is one for which at least one metal of Pd, Pt, Ru, and Ag is contained at a concentration of 50 mol % or greater.

As the conductive metal constituting the core material, Cu, Au, or Ag is a candidate. If it is considered that practical utility is important, it is preferred that at least one of Cu and Au is used as the main component. Cu is low in material cost, high in electrical conductivity, and comparatively good in operability, such as good and easy ball formation if a shield gas is sprayed at the time of ball formation. Au has an advantage in that oxidation resistance is strong, no shield gas is necessary at the time of ball formation, deformation at bonding is good, the bondability is easily ensured, and the like. Ag is superior in electrical conductivity, however, the wiredrawing process is somewhat difficult and therefore, the production technology needs to be made appropriate. On the other hand, with Cu and Au, there is vast operating experience in use as a material for a monolayer bonding wire, which is an advantage.

If the core material is an alloy containing the said conductive metal as its main component, this may be advantageous for wire thinning or bonding reliability improvement by increasing the wire strength. In the case of a Cu alloy, if at least one of In, Ca, B, Pd, Bi, Zr, Ag, and P is contained in the range of 5 to 300 ppm, an effect of improvement in the linearity at a long span up to approximately 5 mm is obtained due to increase in tensile strength and elastic modulus of the bonding wire. In addition, it has been confirmed that even in the case of a short span which is equal to 0.5 mm or less and a low loop, which is a necessary bonding technique for small-sized packages, a high improving effect in the linearity is obtained as the above-identified improvement effect. Enhancement of the aforementioned doping action is not sufficient for a monolayer wire of Cu. On the contrary, it has been confirmed that a higher effect is obtained if the doping is applied to a multilayer wire containing Cu as its main component. Namely, a multilayer-structured bonding wire comprising the core material and the skin layer satisfies the aforementioned crystal grain size ratio of a/b≦0.7, wherein the core material is made of a Cu alloy containing at least one of In, Ca, B, Pd, Bi, Zr, Ag, and P in the range of 5 to 300 ppm, and the skin layer contains Pd, Pt or Ru as its main component. Thus, the effect of improving the linearity at a short span and a low loop is further enhanced. As the reason of this, it is considered that a synergistic effect of the skin layer whose crystal orientation is controlled, and the core material containing an alloying element enhances the linearity.

A multilayer-structured bonding wire comprising the core material and the skin layer satisfies the aforementioned crystal grain size ratio of a/b≦0.7, and more preferably, the main component constituting the skin layer is Pd or Ag, the main component constituting the core material is Cu, and the core material contains Pd in a range of 5 to 10000 ppm. In this case, this wire is effective for reducing the spring failure and stabilizing the stud bump height, where the compressive bonding height at the bonded portion of a ball may be stabilized. As the factors that lower the productivity of the reverse bonding method, unstable stud bump height and spring failure where the loop is flexed and deformed are known. In particular, in the case of the overhang type that necessitates especially a strict bondability among the stacked chip structures, the aforementioned effect of the reduction in spring failure and simultaneous stabilization of the stud bump height, is made prominent by doping Pd to the core material. Since the overhang type stacked chips are structured in such a way that the largest chip is not partially fixed at a position right below it, weak bonding where the load, ultrasound, and the like are lowered, is required when wedge bonding is carried out on the bump formed on an electrode of the chip, in order to avoid warping and destruction of the chip. Accordingly, the breaking strength at the time of tail cutting is increased, resulting in a problem in that the occurrence frequency of spring failure becomes higher than for the ordinary bonding configuration. It is considered that by the aforementioned wire where Pd is doped into the core material, spring failure can be prevented due to a synergetic effect of making the change in Pd concentration uniform and gentle that occurs at the time when Pd existing in the core material and Pd or Ag existing in the skin layer diffuse mutually in the vicinity of the interface between the core material and the skin layer during the heat treatment for wire production. Moreover, it is expected that the aforementioned effect of improving the loop linearity by doping Pd will give an effect for the prevention of spring failure. Since such concentration change of Pd in the wire gives an effect not only to the whole wire but also to the neck portion thereof that receives the heat for ball melting more effectively, it is effective in stabilizing the stud bump height also. It is considered that the reason why the stud bump height can be stabilized is that an action of stabilizing the fracture length in stud bump formation is generated by uniformizing the distribution of the recrystallized grain diameter in the neck portion between the central part of the wire and the vicinity of the surface thereof. In addition, when the core material made of Cu and the skin layer made of Pd are combined, there is a case where Cu and Pd or Ag are mixed nonuniformly when the ball is melted, resulting in an abnormal shape of the ball. However, by doping Pd into the core material, the initial ball size is stabilized and as a result, the effect of stabilizing the compressive bonding height at the ball portion is enhanced. Here, if the concentration of Pd contained in the core material is 5 ppm or greater, the aforementioned effect is confirmed. Preferably, if it is 200 ppm or greater, the effect of stabilizing the stud bump height in overhang type of stacking is enhanced furthermore. If the upper limit of the Pd concentration is 10000 ppm or less, chip damage caused by hardening of the ball can be prevented. Preferably, if it is 8000 ppm or less, the effect of preventing the chip damage is enhanced, which is advantageous for fine pitch bonding.

In the case of Au alloy, if at least one of Be, Ca, Ni, Pd, and Pt is contained in the range of 5 to 9500 ppm, a similar effect is obtained and it is easy to ensure good linearity. Further, it has been confirmed that even in the case of a short span which is equal to 0.5 mm or less and a low loop, which is a necessary bonding technique for small-sized packages, a high effect of improving the linearity is obtained as the above-identified improvement effect. Namely, it is preferred that a multilayer-structured bonding wire comprising the core material and the skin layer satisfies the aforementioned crystal grain size ratio of a/b≦0.7, wherein the core material is made of an Au alloy containing at least one of Be, Ca, Ni, Pd, and Pt, contained in the range of 5 to 9500 ppm, and the skin layer contains Pd, Pt, Ru, or Ag as its main component.

With the multilayer-structured bonding wire, an intermediate metal layer made of a component different from the main components constituting the skin layer and the core material may be provided between the skin layer and the core material. In this case, it is advantageous for controlling the aforementioned textures, such as the grain size in the skin layer. This is because when the skin layer is formed, it may receive an effect from the texture of an underlying material. Therefore, controlling the composition, grain size, thickness, and the like of the intermediate metal layer formed on the core material is comparatively easier than that of the skin layer.

Namely, it is preferred that a multilayer-structured bonding wire comprises an intermediate metal layer provided between the skin layer and the core material, said intermediate metal layer being made of a component different from the main components constituting the skin layer and the core material. An effect caused by adding the intermediate metal layer is that the peel strength, which is one of the indices showing the bonding strength at the wedge bonded portion, can be raised due to the improvement in the adhesion property between the skin layer and the core material. Here, the peel strength can be measured by a simple and easy method of measuring the pull strength in the vicinity of the wedge bonded portion. For this reason, the peel strength can be increased by inserting the intermediate metal layer. Here, the component of the intermediate metal layer should be selected according to the combination of the components of the skin layer and the core material. For example, Au, Pd, Pt, Rh, and Ag may be used. In particular, Au, Pd, and Pt are preferred. More preferably, in the case where the combination of the main component of the skin layer and that of the core material is Pd and Cu, if the main component of the intermediate metal layer is Au, it is advantageous in controlling the aforementioned textures of the skin layer and the core material. Furthermore, the adhesion property at the respective interfaces among the skin layer, the intermediate metal layer, and the core material is comparatively good. In the case where the combination of the main component of the skin layer and that of the core material is Pd and Au, if the main component of the intermediate metal layer is Pt, it is advantageous in stabilizing the texture, composition, thickness, and the like of the skin layer.

If the thickness of the skin layer is in the range of 0.005 to 0.3 μm, in addition to improving the aforementioned leaning failure and spring failure, it is easy to satisfy comprehensively the required properties, such as bondability, loop control, and so on. If the thickness is equal to 0.005 μm or greater, an effect by the skin layer whose surface texture has been controlled is obtained sufficiently. If the thickness exceeds 0.3 μm, hardening of the ball portion due to alloying becomes prominent and therefore, a problem in that damage such as cracks is given to the chip at the time of bonding may arise.

Preferably, if the thickness of the skin layer is in the range of 0.01 to 0.25 μm, a desired loop shape can be formed stably without decreasing the speed even in the case of complicated loop control. More preferably, if it is in the range of 0.02 to 0.2 μm, a stable quality of the skin layer such as an increase in the processing efficiency in the film formation step can be easily obtained, while keeping the performance in use of the bonding wire.

If the thickness of the intermediate metal layer is in the range of 0.003 to 0.2 μm, adhesion to the interface with the core material can be raised and complicated loop control can be accepted. Preferably, if it is in the range of 0.007 to 0.1 μm, uniformity and reproducibility of the film quality can be ensured easily.

Here, the boundary between the skin layer and the core material is defined as the position where the total amount of the detected concentration of the conductive metal constituting the skin layer is 50 mol %. Therefore, the skin layer in the present invention corresponds to the region from the position where the total amount of the detected concentration of the conductive metal constituting the skin layer is 50 mol % to the surface of the wire. In other words, the region where the total amount of the detected concentration of the conductive metal constituting the skin layer is 50 mol % or greater.

The crystal grain size of the skin layer, crystal grain size of the core material in the normal cross section which is a cross section that is normal to the wire axis, and crystal grain size of the core material in the axial cross section which is a cross section including the wire axis and along the longitudinal direction described above are measured after identifying the respective crystal grain boundaries (boundaries among the crystal grains) and clarifying the shape of the crystal grains in the following way. The crystal grain boundaries are identified by a method of directly observing the crystal grain boundaries using a chemical etching or CP (Cross-section Polishing) method, or a method of analyzing the crystal grain boundaries using the Electron Back scattering Pattern (which will be termed EBSP) method. With the chemical etching method, if a liquid chemical and an etching condition suitable for the material, structure, and the like of the skin layer or the core material are selected, the texture such as the crystal grain can be observed easily and simply. As the liquid chemical, for example, an acid water solution, such as hydrochloric acid, nitric acid, sulfuric acid, and acetic acid may be used. The concentration (pH) of the acid water solution and the etching condition, such as temperature and time are selected and then, the crystal grain boundaries are selectively melted or a specific crystal face is selectively dissolved to identify the grain boundaries. Thereafter, the crystal grain shape is observed. With the CP method, for example, a cross section of a sample is formed using a broad beam of argon ions generated by an acceleration voltage of 2 to 6 kV and then, the crystal grain boundaries are clarified, and the crystal grain shape is observed.

With the EBSP method, since the orientations of the respective crystal grains can be measured, the crystal grain boundaries can be fixed. In the present invention, the crystal grain boundary is defined in such a way that the orientation difference between the adjoining crystal grains is 15° or greater.

With the texture observation using the EBSP method, usually, if the sample has large bumps and dips or a large curvature, it is difficult to measure the crystal orientation with high precision. In other words, when the skin layer is observed, a curved surface causes a problem. However, if the measuring condition is made appropriate, measurement and analysis can be observed with high precision. Concretely speaking, when the skin layer is observed, as shown in FIG. 1, a bonding wire 1 is fixed on a flat surface in such a way as to be linear and then, a flat portion 8 of the wire 1 near the central part thereof is measured by the EBSP method. If the size of the measuring area along the circumferential direction is 50% of the wire diameter or less while the center extending along the longitudinal direction of the wire 1 is defined as an axis, and the size of the said region along the longitudinal direction is 100 μm or less, then the measurement efficiency can be raised in addition to accuracy. Preferably, if the size along the circumferential direction is 40% of the wire diameter or less and the size along the longitudinal direction is 40 μm or less, then measurement efficiency can be raised furthermore due to reduction of the measuring time.

To perform high-precision measurement using the EBSP method, it is preferred that the measurement operation is carried out at three points or more to obtain average information in consideration of dispersion, because the measurable area at each point is limited. It is preferred that the measuring positions are chosen so as not to be adjacent to each other, in such a way that different areas along the circumferential direction can be observed.

For example, in the case of measuring a bonding wire having a diameter of 25 μm, plural bonding wires are used that are fixed on a flat surface in such a way that the orientations of the respective wires are varied from one another as much as possible. The measuring area at one time is determined to have a size of 8 μm along the circumferential direction with the wire axis as the center, and a size of 30 μm along the longitudinal direction. The measuring operation is carried out at three points at 1 mm or more apart from each other. In this way, the average information about the surface texture of the bonding wire can be obtained. However, the choice of the measuring area and position is not limited to this, and it is desirable that these are determined appropriately in consideration of the measuring apparatus, the state of the wire, and the like.

Figure 2A:
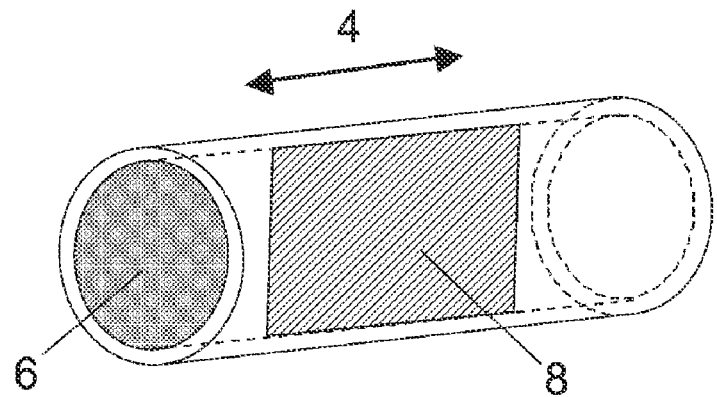
Figure 2B:
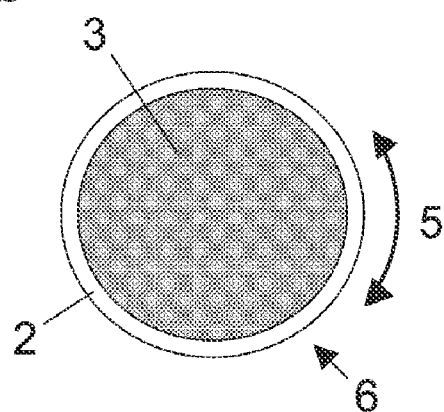
Figure 2C:
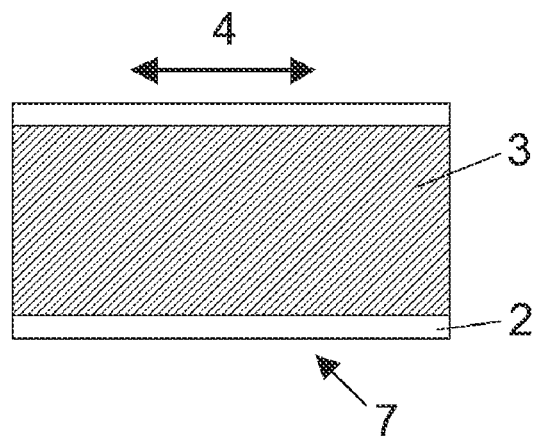

Moreover, when the texture (crystal grains) of the core material is observed, as shown in FIG. 2, the cross section (normal cross section) 6 normal to the wire axis or the cross section (axial cross section) 7 including the wire axis and extending along the longitudinal direction are measured. When the crystal grain size (b) of the core material in the normal cross section is measured, the normal cross section is directly observed, and when the crystal grain size (d) of the core material along the wire axis is measured, the axial cross section is directly observed. If the cross section is formed by mechanical polishing, it is desirable to eliminate the outermost layer by etching to remove residual strain on the polished surface.

When the measurement results obtained by the EBSP method are analyzed, the average crystal grain sizes along the longitudinal (axial) and circumferential directions can be calculated by utilizing the analyzer software incorporated into the measuring apparatus.

The above-described average crystal grain sizes are calculated as an arithmetic mean. At least five crystal grain sizes are averaged. In the present invention, it is not necessary that the average crystal grain sizes obtained by all the aforementioned analyzing methods satisfy the prescribed ranges of the present invention. If the average crystal grain size obtained by one of the analyzing methods satisfies a corresponding one of the prescribed ranges of the present invention, the effect(s) of the present invention can be obtained.

On the occasion of producing the bonding wire of the present invention, the step of forming the skin layer on the surface of the core material and the processing and heat-treatment step of controlling the structures of the skin layer, the diffusion layer, the core material, and the like are required.

As the method of forming the skin layer on the surface of the core material, plating, evaporation, and melting methods may be used. With the plating method, electroplating and electroless plating may be selectively used. In electroplating, the plating rate is high and the adhesion property to the underlying material is good. One electroplating process may be acceptable. However, the electroplating process may be divided into the thin-film plating termed flash plating, and the main plating for growing the thin-film thus formed. If the electroplating process is divided into these plural steps to be carried out, it is advantageous in stabilizing the film quality. The solutions used for electroless plating are divided into the substitution type and the reduction type. When the film is thin, only the substitution type plating may be sufficient; however, when a thick film is formed, it is effective that the substitution type plating is performed and thereafter, the reduction type plating is performed in stages. Although the apparatus and the like for electroless plating are simple and easy, it takes a longer time than that for electroplating.

With the evaporation method, physical vapor deposition, such as sputtering, ion plating, vacuum evaporation, and chemical vapor deposition (CVD) may be used. Since these are of the dry type, cleaning after film formation is unnecessary and there is no concern about surface contamination during the cleaning process.

Regarding the stage where plating or evaporation is performed, both of a method of forming a conductive metal film at an intended diameter and a method of forming a conductive metal film on the thicker core material and wiredrawing the said core material plural times to have an intended diameter are available. In the case where the film formation is carried out at the final diameter in the former method, production and quality control are simple and easy, while in the case where the film formation and wiredrawing are combined in the latter method, the adhesion property between the film and the core material is advantageously enhanced. As concrete examples of the respective methods, a process of forming a film on a thin wire having an intended diameter in an electroplating solution while the thin wire is swept continuously, or a process of dipping a thicker wire into an electroplating or electroless plating bath to form a film thereon and wiredrawing the said wire to the final diameter may be used.

Here, in the aforementioned final plating method where the skin layer is formed on the core material with the final diameter, the heat treatment step is needed only after the film formation. In the thicker-diameter plating method where the film is formed on the core material with a thicker diameter than the final one, it is necessary that the processing step of obtaining the intended diameter and the heat treatment step are combined together.

In the processing step after forming the skin layer, rolling, swaging, die drawing, or the like is selected and is used according to the purpose. Controlling the process texture, dislocations, defective crystal grain boundaries, and the like, using the processing speed, the drafting rate, or the reduction rate in area of the die will affect the texture, adhesion property, and the like of the skin layer.

The crystal grain sizes on the surface of the skin layer and in the inside thereof are unable to be controlled even if film formation, processing and heating are simply applied to a wire. Even if annealing for removing the process strains at the final diameter, which is used in ordinary wire production, is applied as it is, loop control becomes unstable due to the adhesion property degradation between the skin layer and the core material. Therefore, it is difficult to control the quality uniformity of the skin layer along the longitudinal direction of the wire, and the distributions of the skin layer, the diffusion layer, and the like on the cross section of the wire.

To have a respective control on the crystal grain size of the skin layer and that of the core material, it is desirable to make the materials for alloy and the production techniques as appropriate.

To give priority to miniaturization of the crystal grain size of the skin layer, for example, it is effective to lower the drafting rate or the reduction rate in area of the drawing die in one step of processing in such a manner that the process strains are concentrated on the vicinity of the wire surface. Moreover, since the crystal grain size of the skin layer along the axial direction of the wire becomes larger with the increasing processing degree, the crystal grain sizes of the skin layer along the circumferential direction of the wire and along the axial direction thereof are determined by the drafting rate or the reduction rate in area, even if the drafting rate or the reduction rate in area has been lowered for miniaturizing the crystal grain size.

To enlarge the crystal grain size of the core material, it is effective to subject the core material before the formation of the skin layer to heat treatment, thereby making the recrystallized grains to be coarse. In addition, for example, the crystal grain sizes of the core material on the normal cross section and the axial cross section can be designed by combination of the recrystallization of the core material before the formation of the skin layer and the processing applied to the said core material. Further, it is effective to make the levels of progress in recrystallization of the skin layer and the core material different through control of the heat treatment temperature, by utilizing the material difference between the skin layer and the core material. For example, if a wire on which the skin layer has been formed and to which the processing has been applied is used, and the heat treatment temperature in the heat treatment step during the process or at the final diameter is set at a value which is below the recrystallization temperature of the material of the skin layer and higher than the recrystallization temperature of the material of the core material, the crystal grain size ratio a/b of the skin layer and the core material can be easily restricted to a low level. Here, the recrystallization temperatures of the skin layer and the core material can be raised or lowered by changing their materials, alloying, and the degree of processing.

In the heat treatment process, it is effective to perform heat treatment once or plural times. The heat treatment process is classified to be annealing immediately after the film formation, annealing during the processing, and finish annealing at the final diameter. It is important to use these annealing types selectively. The final skin layer, the diffusion behavior at the interface between the skin layer and the core material, and the like vary depending upon which stage of the processing the heat treatment is carried out. As an example, a wire is subjected to an intermediate annealing during the processing after a plating process and thereafter, the wire is drawn and subjected to finish annealing at the final diameter thereof, resulting in a desired bonding wire. This is advantageous in forming a diffusion layer at the interface between the skin layer and the core material, thereby improving the adhesion property compared with the process that does not include the intermediate annealing.

Regarding the heat treatment method, a wire is subjected to a heat treatment while continuously sweeping the wire in a furnace, and further, a temperature gradient is provided in the furnace rather than keeping the temperature in the furnace constant as for ordinary heat treatment. In this way, a bonding wire comprising the skin layer and the core material according to the feature of the present invention can be produced easily. As a concrete example, a scheme of locally introducing a temperature gradient, or a scheme of changing the temperature in the furnace may be used. In the case of suppressing surface oxidation of a bonding wire, it is effective to heat the wire while also feeding an inert gas, such as N2 or Ar into the furnace.

The melting method is a method of melting the skin layer or the core material and casting the same. If the skin layer and the core material are connected to each other to have a thick diameter of approximately 10 to 100 mm and thereafter, they are drawn, there are advantages in that excellent productivity is obtained, the alloying component of the skin layer can be designed easily compared with the evaporation method, and the properties, such as the strength and the bondability can be improved easily. The specific process is divided into a method of casting a molten conductive metal into the periphery of the core material which has been formed beforehand, and forming the skin layer, and a method of casting a molten metal into the central part of a hollow cylinder which has been formed by a conductive metal beforehand, and forming the core material. The latter where the core material is cast into the inside of the hollow cylinder is preferred because a concentration gradient of the main component of the core material can be formed in the skin layer stably and easily. Here, if a small amount of one component of the core material (e.g., copper) is doped into the skin layer which has been formed beforehand, the concentration of the doped component on the surface of the skin layer can be controlled easily. The heat treatment operation for diffusing the doped component into the skin layer may be omitted in the melting method; however, if heat treatment is given to adjust the distribution of the doped component in the skin layer, further improvement in properties is expected.

Moreover, when such molten metal is utilized, at least one of the core material and the skin layer may be produced by continuous casting. Due to continuous casting, the processes can be simplified compared with the aforementioned casting method, and the wire can be made thinner to increase the productivity also.

When bonding is carried out using a multilayer copper wire comprising the core material whose main component is copper, a shield gas is necessary during ball formation, where a N2 mixed gas containing H2 in the range of 1 to 10% or a pure N2 gas is used as the shield gas. For the conventional monolayer copper wire, a mixed gas, a representative example of which is a N2 mixed gas containing 5% of H2 (5% H2+N2 gas), has been recommended. On the other hand, with a multilayer copper wire, good bondability is obtained even if an inexpensive pure N2 gas is used. Therefore, the running cost can be reduced compared with the use of a 5% H2+N2 gas as the standard gas. It is preferred that the purity of a N2 gas is 99.95% or greater. Namely, it is desirable for a bonding method where a ball portion is formed while spraying a N2 gas whose purity is 99.95% or greater on the tip of a wire or the vicinity thereof and inducing arc discharge and then, the ball portion thus formed is bonded.

If a diffusion layer is formed between the skin layer and the core material, the adhesion property can be improved. The diffusion layer is a region formed by mutual diffusion of the main components of the core material and the skin layer and has a concentration gradient of the main components. Since the adhesion property between the core material and the skin layer is improved by formation of the diffusion layer, failures, such as a break during wiredrawing, and a bend during heat treatment can be reduced in the wire production processes, thereby improving the yield and productivity. Moreover, since the diffusion layer has the concentration gradient of the conductive metal, the effect of raising the productivity by suppressing the break during high-speed wiredrawing is enhanced compared with the case where the concentration of the conductive metal is uniform over the entire skin layer. Namely, a multilayer-structured bonding wire comprising the core material and the skin layer satisfies the aforementioned crystal grain size ratio of $a/b \leq 0.7$, and more preferably, a diffusion layer with a concentration gradient is provided. This is advantageous for productive improvement of a wire. Preferably, the relationship of the aforementioned average crystal grain size ratio of $a/b \leq 0.7$ and the aforementioned hardness ratio of $SH/CH \geq 1.3$ are simultaneously satisfied and more preferably, a diffusion layer with a concentration gradient is provided. In this case, it has been confirmed that production yield improvement for thin wires with a diameter of 20 μm or less and stabilization of mechanical properties of a final product are obtained effectively. Because the skin layer becomes harder and the core material becomes softer with the increasing hardness ratio of SH/CH, a high effect of reducing the break of wire during wiredrawing of an ultrathin wire is obtained. It is preferred that the concentration gradient in the diffusion layer has a concentration change of 10 mol % per 1 μm or greater along the depth direction. If the concentration change is 5 mol % per 0.1 μm or greater, a high effect of mutually utilizing the different physical properties of the skin layer and the core material without loss of these physical properties is expected. It is desirable that the thickness of the diffusion layer is in the range of 0.002 to 0.3 μm. This is because if the thickness of the diffusion layer is less than 0.002 μm, the effect is insufficient and identification by analysis is difficult, and if the thickness of the diffusion layer is greater than 0.3 μm, the texture of the skin layer is affected and thus, the aforementioned crystal orientation is difficult to be formed stably. In the case where an intermediate metal layer is provided between the core material and the skin layer, it has been confirmed that if a diffusion layer is formed between the skin layer and the intermediate metal layer or between the core material and the intermediate metal layer, the same improvement effect as that of the aforementioned diffusion layer is obtained. To control the diffusion layer, it is effective to utilize heat treatment. As described previously, by controlling the degree of progress of diffusion through the combination of heat treatment and processing, a desired diffusion layer can be formed uniformly along the circumferential or longitudinal direction of the wire.

According to the definition of the diffusion layer in the present application, a region having a detected Pd concentration of 10 to 70 mol % is defined as the diffusion layer from the viewpoint of the performance, such as the adhesion property, strength, and looping property or productivity or the like. This is because if the Pd concentration of the diffusion layer is within this range, the Pd concentration is low and the diffusion layer plays a different part from the skin layer and the core material. As described previously, the skin layer is defined as a region having a detected Pd concentration of 50 mol % or greater. In other words, the skin layer corresponds to the region from the position where the detected Pd concentration is 50 mol % to the surface of the wire. Here, the region whose Pd concentration is 50 to 70 mol % is included in both of the thicknesses of the skin layer and the core material. This is because this concentration range has a wire bonding-related function which is common to both the skin layer and the core material. Regarding the concentration of the skin layer and the diffusion layer described here, concentration ratios which are obtained by summing the concentrations of the metal elements constituting the skin layer and the core material are used, where the concentrations are calculated in such a way that the gaseous components, such as C, O, N, H, Cl, and S, and the nonmetal elements existing in the vicinity of the surface are excluded.

The concentration analysis of the skin layer, the core material, and so on, may be carried out by utilizing Electron Probe Micro Analysis (EPMA), Energy-Dispersive X-ray diffraction (EDX), Auger Electron Spectroscopy (AES), Transmission Electron Microscope (TEM), or the like. In particular, AES has a high spatial resolution and therefore, it is effective for concentration analysis of a thin region in the outermost surface. Moreover, to study normal compositions, a material to be researched may be dissolved into a solution, such as an acid, from its surface step by step and then, the concentration of a substance included in the solution may be measured, finding the composition of the dissolved portion. In the present invention, it is not necessary that the concentration values obtained by the aforementioned analyzing methods satisfy the prescribed ranges of the present invention. It is sufficient that the concentration value obtained by one of the analyzing methods satisfies a desired condition.

EXAMPLES

Examples will be explained below.

Regarding the raw materials for a bonding wire, high-purity materials for Cu, Au, and Ag with a purity of approximately 99.99% by mass or greater were used for the core material, and materials of Au, Pt, Pd, Ru, Rh, and Ag with a purity of 99.9% by mass or greater were used for the skin layer or the intermediate metal layer.

To use a thinned wire to a certain diameter as the core material and to form a layer of a different metal on the surface of the wire, an electroplating, electroless plating, evaporation, or melting method was carried out and then, heat treatment was performed. As the electroplating solution and electroless plating solution, commercially available plating solutions for semiconductor technologies were used, and sputtering was used as the evaporation method. A wire having a diameter of approximately 25 to 1500 μm was prepared in advance and a coating was applied on the surface of the wire by evaporation, plating, or the like. Then, the wire was drawn to have the final diameter of 13 to 25 μm. Finally, a heat treatment was applied in such a way that the process strains were removed and that the elongation value was in the range of 5 to 15%. After the wire was drawn with a die to have a diameter of 25 to 200 μm, heat treatment for diffusion was applied to the wire and moreover a wiredrawing process was applied according to necessity. The reduction rates in area of the wiredrawing dies were prepared in the range of 5 to 15% per die and used in combination to adjust introduction of processing strains in the surface of the wire. The wiredrawing rate was made appropriate in the range of 20 to 500 m/min.

When the melting method was used, a method of casting a molten metal into the periphery of the core material that was formed in advance was adopted. Subsequently, processing such as forging, rolling, wiredrawing with a die, and so on, and heat treatment were performed, thereby producing a bonding wire.

With the heat treatment of the wire according to the present invention, the wire was heated while being swept continuously. A scheme of locally introducing a temperature gradient, a scheme of changing the temperature in the furnace, or the like, was utilized. For example, a heat treatment furnace which was modified in such a manner that the in-furnace temperature was able to be controlled separately in the three sections was utilized. For example, the temperature distribution was set in such a way that the high, medium, and low temperature sections are aligned or the medium, high, and low temperature sections are aligned from the wire entrance to the wire exit, where the heating lengths in these sections were managed. The wire sweeping rate was also made appropriate in addition to the temperature distribution. Regarding the heat treatment atmosphere, an inert gas, such as N2 and Ar was utilized for the purpose of preventing oxidation. The gas flow rate was adjusted within the range of 0.0002 to 0.004 m³/min, which was utilized for controlling the inside temperature of the furnace. The timing of heat treatment to be performed was classified into two types; one type is that heat treatment was applied to the drawn wire and thereafter, the skin layer was formed thereon, and the other type is that heat treatment was carried out before the processing, during the processing, or immediately after the formation of the skin layer twice or more.

To control the crystal grain size of the skin layer and that of the core material separately, as described above, it was effective to make the materials, alloying, and the degree of processing appropriate. Miniaturization of the crystal grain size of the skin layer was accelerated by reducing the drafting rate or the reduction rate in area of the drawing die in each process. The crystal grain sizes of the skin layer along the circumferential and axial directions were controlled by increasing or decreasing the drafting rate or the reduction rate in area thus reduced. Increase of the crystal grain size of the core material was accelerated by applying heat treatment to the core material before the skin layer was formed thereon or by decreasing the processing degree. The crystal grain sizes of the core material on the normal and axial cross sections were adjusted by the combination of the heat treatment condition (temperature and time) and the processing degree. Furthermore, the processing procedure prior to the heat treatment, the heat treatment temperature, and so on were made appropriate in such a way that the heat treatment temperature at the final diameter was set to be lower than the recrystallization temperature of the material of the skin layer and higher than the recrystallization temperature of the material of the core material.

The degrees of processing in rolling and wiredrawing after forming the skin layer are able to be summarized by the cumulative processing rate calculated by the ratio in area between the wire diameter at the time of skin layer formation and the final wire diameter. If the processing rate (%) was less than 30%, the processing degree was denoted by R1. If the processing rate (%) was equal to 30% or greater and less than 70%, it was denoted by R2. If the processing rate (%) was equal to 70% or greater and less than 95%, it was denoted by R3. If the processing rate (%) was greater than 95%, it was denoted by R4.

Regarding the texture observation of the wire surface, the crystal grain shape was measured by the EBSP method in a certain region on the surface of the skin layer of the bonding wire. When the measuring samples were prepared, 3 to 5 bonding wires were fixed on a flat plate in such a way that their orientation was varied as much as possible. The measuring area was set as a rectangular area including the wire axis, and the measuring area at one time for the crystal grain size was determined to have a size of 5 to 10 µm along the circumferential direction and 10 to 50 µm along the longitudinal direction. The measurement was carried out at 3 to 10 points apart from each other by 0.5 mm or greater. The interval between the measuring points was set at 0.01 to 0.2 µm. The measuring results for the bonding wire having a diameter of 25 µm or less were obtained by the EBSP method and were compared with each other. It was confirmed that a similar tendency is observed even if the diameter of the bonding wire is smaller.

Regarding the texture study of the core material, the crystal grain shape was measured by the EBSP method using a sample which was obtained by polishing a cross section of a bonding wire and reducing the process strains in its surface by chemical etching. Measurement was performed on the normal cross section which was normal to the wire axis and the axial cross section which included the wire axis and extended along the longitudinal direction.

The data obtained by the EBSP method were analyzed using dedicated software (OIM analysis, produced by TSL, or the like). The crystal grain shape in the measuring area was analyzed to obtain the crystal grain size. The crystal grain size of the skin layer and that of the core material were measured along the respective directions by the aforementioned method, and ten of the crystal grain sizes were averaged, resulting in the average size.

With the hardness measurement of the skin layer, the nanoindenter hardness measurement was performed along the normal direction with respect to the wire surface, and the average hardness value at five points was obtained. The load was chosen in the range of 1 mN to 20 mN according to the thickness and hardness of the skin layer. With the hardness measurement of the core material, the micro Vicker's hardness was measured at five points on the axial cross section which is a cross section along the longitudinal direction of the wire, and the average hardness value was obtained. The load was adjusted in the range of 0.09807 to 9.807 N according to the hardness. To correct the hardness difference due to the difference of the measuring method, the micro Vicker's hardness measurement and the nano-indenter hardness measurement on the axial cross section were performed for several samples and then, correction was carried out by obtaining a conversion equation from the hardness values of the two measuring methods.

The processability of the wire was evaluated by the number of breaks occurring in the drawing process for drawing a thick wire with a diameter of 500 µm to the final diameter with a diameter of 25 or 17 µm (wiredraw processability). The sample had a length of 5000 m when the diameter was 500 µm and then, it was drawn. To perform a strict accelerated evaluation for failure, wiredrawing was carried out at a speed twice or three times as fast as the ordinary one. If the number of breaks was 0, very high productivity was expected and therefore, the sign of a double circle was used for notation. If the number of breaks was 1 to 2, it was judged that productivity was good and therefore, a circle mark was attached. If the number of breaks was 3 to 6, a drawing condition change was needed to some extent and therefore, a triangle mark was attached. If the number of breaks was 7 or more, there was concern that productivity was degraded and therefore, a cross mark was attached.

To measure the thickness of the skin layer on the wire surface or the intermediate metal layer, depth analysis using AES was employed, and to observe the element distribution, area analysis or line analysis using AES, EPMA, or the like was carried out. With the depth analysis using AES, measurement was carried out along the depth direction while being sputtered, and the depth thus measured was shown using an $SiO_2$-converted unit. The concentration of the conductive metal in the wire was measured by ICP analysis, ICP mass spectrometry, or the like.

When a diffusion layer having a concentration gradient was observed between the skin layer and the core material in the depth analysis using AES, and the thickness of the diffusion layer was 0.002 to 0.2 µm, a circle mark was placed at the column "diffusion layer" of Table 1.

A commercially available automatic bonder was used for bonding wire connection, and ball-wedge bonding was performed. A ball was formed at the tip end of a wire by arc discharge and bonded to an electrode film on a silicon substrate, and the other end of the wire was wedge-bonded to a lead terminal. As the shield gas for preventing the oxidation at the time of ball formation, pure $N_2$ gas was mainly used. The gas flow rate was adjusted in the range of 0.001 to 0.01 $m^3$/min.

As an object to be bonded, an Al alloy film (Al-1% Si-0.5% Cu film, or Al-0.5% Cu film) with a thickness of 1 µm, which was the material of the electrode film on the silicon substrate, was used. On the other hand, as an object to be bonded by wedge bonding, a lead frame whose surface was plated with Ag (thickness: 2 to 4 µm) was used. In addition, regarding the bondability to an Au/Ni/Cu electrode on a BGA substrate, it was confirmed that a similar effect to the above lead frame was obtained, using part of the wire samples.

Regarding the leaning failure which is a phenomenon where an upright portion of a wire in the vicinity of a ball bonded portion can lean (leaning property), evaluation was made by observing an upright portion of a wire along the horizontal direction of a chip, and finding the interval (leaning interval) when the interval between a perpendicular line penetrating through the center of a ball bonded portion and the upright portion of the wire is maximized. The length of the wire was 4 mm, and the number of the samples was 50. The maximum loop height was set at an ordinary value of approximately 200 µm and a stricter value of approximately 350 µm for leaning evaluation. If the aforementioned leaning interval was smaller than the wire diameter, leaning was judged to be good, while if it was larger than the wire diameter, leaning was judged as bad. The measurement results were classified in accordance with the occurrence frequency of leaning failure. In the case where leaning failure occurred at three wires or more, a triangle mark was attached; in the case where leaning failure occurred at zero wires, a double circle mark was attached; in the case where leaning failure occurred at an intermediate number between them, a circle mark was attached.

Regarding the adaptability to stacked chip bonding, the wire bend at the time of different levels of reverse bonding was evaluated (bending property at different-level reverse bonding). A stud bump was formed on the aforementioned electrode in such a way that a ball bonded portion was lower in position than a wedge bonded portion and then, wedge bonding was performed on the stud bump. A high level-different chip with a height of 450 μm was used, and bonding was carried out in such a manner that an upright portion of a wire in the vicinity of a ball bonded portion was approximately 350 μm in height. When 200 of the bonding wires thus bonded were observed from their upper position, if at least one of these bonding wires had a maximum leaning quantity of the upright portion equal to four times as much as the wire diameter or greater, it was judged as bad and a triangle mark was attached. If all of these bonding wires had a maximum leaning quantity less than twice as much as the wire diameter, it was judged as good and a double circle mark was attached. If the maximum leaning quantity of these bonding wires was intermediate between them, it was judged that although wire bending had somewhat occurred, no problem would arise in ordinary use, and a circle mark was attached.

Regarding the adaptability to the overhang type stacked chips, the wire bend and bump height stability at the time of reverse bonding was evaluated (bending property for overhang type stacked reverse bonding). Three chips were stacked and the overhang quantity was set at approximately 0.4 mm. A high different-level chip with a height of 450 μm was used, and bonding was carried out in such a manner that an upright portion of a wire in the vicinity of a ball bonded portion was approximately 350 μm in height. When 200 of the bonding wires thus bonded were observed from their upper position, if at least one of these bonding wires had a maximum leaning quantity of the upright portion equal to four times as much as the wire diameter or greater, it was judged bad and a triangle mark was attached. If all of these bonding wires had a maximum leaning quantity less than twice as much as the wire diameter, it was judged good and a double circle mark was attached. If the maximum leaning quantity of these bonding wires was intermediate between them, it was judged that although wire bending somewhat occurred, no problem would arise in ordinary use, and a circle mark was attached.

The bump height stability of the overhang type stacked chips was evaluated (bump height stability for overhang type stacked reverse bonding). Samples were made using the aforementioned overhang type stacked chips in such a state that although a bump was formed, wedge bonding was not performed on this bump, and the bump heights of these samples were measured with an optical microscope for 50 wires. If the standard deviation with respect to the average value of the bump height was greater than 8%, the dispersion was excessively large and therefore, a cross mark was attached; if greater than 2% and less than 8%, the dispersion was somewhat large and an improvement might be necessary, and therefore, a triangle mark was attached; if greater than 0.8% and less than 2%, no problem would occur in practical use and therefore, a circle mark was attached; if equal to 0.8% or less, the bump height was stable and production management was easy, and therefore, a double circle mark was attached.

Neck damage was evaluated by observing the neck portion of a bonding wire bonded using a SEM (neck damage at low loop). Above all, the outer side of the neck portion opposite to a wedge bonded portion was carefully observed as a damage-susceptible position of the neck portion. As the type of damage, minute fissures, large-sized cracks, rumple-shaped fatigue, and the like were checked. Samples were made in such a manner that the wire diameter was 25 μm, the wire length was 2 to 4 mm, and the loop height was set at an ordinary value of 90 μm and a low value of 70 μm. If the loop height is low, the occurrence rate of the neck damage rises. Therefore, evaluation is likely to be stricter. The total number of the wires observed was 300. If the neck damage was observed for 10 wires or more, it was judged bad and therefore, a cross mark was attached; if the neck damage was observed for 5 to 9 wires, it was judged that although no problem would occur with an ordinary use, an improvement would be necessary, and therefore, a triangle mark was attached; if the neck damage was observed for 1 to 4 wires, it was judged that no problem would occur and therefore, a circle mark was attached; if the neck damage was not observed, it was judged that bonding was stable and good, and therefore, a double circle mark was attached.

The loop shape stability in the bonding process was evaluated by two methods, i.e., loop linearity and loop dispersion (looping stability).

To evaluate the linearity of a bonded loop, bonding was carried out at a long span where the wire interval (span) was 5 mm. The diameter of a bonding wire was 25 μm. 30 of the bonding wires were observed from their upper position with a projector, and the deviation of the bonding wire at a position where the bonding wire was farthest apart from the line connecting the ball- and wedge-sided bonded portions was measured as the quantity of bend. If the average quantity of bend was less than the wire diameter, it was judged good and therefore, a double circle mark was attached; if equal to twice as much as the wire diameter or more, it was judged bad and therefore, a triangle mark was attached; if at an intermediate value between them, no problem would occur in an ordinary case and therefore, a circle mark was attached.

Regarding the dispersion of loop height, the loop height was measured at three positions per each wire to obtain the standard deviation thereof, and the dispersion of loop height was evaluated using the standard deviation (height dispersion). To evaluate the practical utility to fine pitch and long span bonding where a stable loop shape was more difficult to be formed, bonding was carried out under the condition that the wire length was 5 mm, the loop shape was trapezoidal, and the loop height was approximately 350 μm. The loops were selected in fifty at a time and an optical microscope was used for measurement. Regarding the measuring positions, three positions, i.e., the upright position of a ball, the highest arriving position, and the central position of the wire length, were selected, where loop height dispersion was likely to occur. If the standard deviation of the loop height was equal to half (½) of the wire diameter or less, the dispersion was judged large, while if less than half (½) of the wire diameter, the dispersion was judged small and good. Based on such a standard for judgment, if the dispersion was small at all of the three positions, it was judged that the loop shape was stable and therefore, a double circle mark was attached; if the dispersion was large at one of the three positions, the loop shape was comparatively good and therefore, a circle mark was attached; if at two of the three positions, a triangle mark was attached; if the dispersion was large at all of the three positions, a cross mark was attached.

To evaluate the linearity of a loop bonded at a short span and a low loop, bonding was carried out at a short span where the wire interval (span) was 0.5 mm and at a target loop height of 80 μm (linearity at short span and low loop). The wire diameter was 25 μm. 40 of the bonding wires were observed from their upper position with a projector, and the deviation of the bonding wire at a position where the bonding wire was farthest apart from the line connecting the ball- and wedge-sided bonded portions was measured as the amount of bend. If the average amount of bend was less than the wire diameter, it was judged good and therefore, a double circle mark was attached; if equal to twice as much as the wire diameter or more, it was judged bad and therefore, a triangle mark was attached; if at an intermediate value between them, no problem would occur in an ordinary case and therefore, a circle mark was attached.

To evaluate the spring characteristic, reverse bonding, which is a bonding method of wedge-bonding a bonding wire onto a stud bump formed on an electrode, was performed and spring failure where a bonding wire bends was observed. The wire diameter was 20 μm, the wire length was 3 mm, and bonding was performed for 1000 bonding wires. The bonding wire thus bonded was observed from an upper position of a chip to check the occurrence number of spring failures. If the number of spring failures was 8 or more, it was judged bad and therefore, a cross mark was attached; if 7 to 4, improvement was desirable and therefore, a triangle mark was attached; if 1 to 3, it was judged that no problem would arise in ordinary use, and a circle mark was attached; if 0, the spring property was very good and therefore, a double circle mark was attached.

With the evaluation of the wedge bondability, accelerated evaluation was performed at a low load and a low temperature where detachment failure increases. The bonding temperature was 160° C., and a Cu lead frame which was plated with Ag was used as an object to be bonded. Continuous bonding was carried out for 1000 bonding wires having a diameter of 20 μm, and the bonding wires were classified according to the frequency of failure occurrence for detachment occurring at a wedge bonded portion. If the number of the detached wires was 6 or more, it was judged bad and a cross mark was attached; if 5 to 3, an improvement is desirable and therefore, a triangle mark was attached; if 1 or 2, it was judged that no problem would arise in ordinary use, and a circle mark was attached; if 0, the wedge bondability was good and therefore, a double circle mark was attached.

For evaluation of the peel bonding strength, a pull test at a wedge bonded portion was used. The wire diameter was 25 μm and the span was 2 mm. A hook which was hooked with a loop at a position nearer to the wedge bonded portion than three quarters (¾) of the wire length was moved upward, and the breaking strength of a bonding wire was measured. Since the pull strength varies depending on; the diameter of a bonding wire, loop shape, bonding condition, and the like, a relative ratio (Rp) of the pull strength to the wire tensile strength rather than the absolute value was used. If Rp was 20% or greater, the wedge bondability was good and therefore, a double circle mark was attached; if equal to 15% or greater and less than 20%, it was judged that no problem would occur and a circle mark was attached; if equal to 10% or greater and less than 15%, it was judged that a malfunction might occur and a triangle mark was attached; if equal to or greater than 10%, there was a problem in the mass production process and therefore, a cross mark was attached.

In the evaluation of damage to a chip, after a ball portion was bonded onto an electrode film, the electrode film was removed by etching and damage to an insulating film or a silicon chip was observed with a SEM (chip damage). The electrodes were observed at 400 points. If no damage was recognized, a double circle mark was attached; if two or less cracks which were less than 5 μm were recognized, it was judged that no problem would occur and a circle mark was attached; if two or more cracks which were equal to 5 μm or greater and less than 20 μm were recognized, it was judged that there was concern and a triangle mark was attached; if one or more cracks which were equal to 20 μm or greater or crater destruction or the like was recognized, it was judged that there was concern and a cross mark was attached.

Tables 1 and 2 show the examples of a bonding wire with a diameter of 25 μm according to the present invention, and comparative examples.

TABLE 1

| | | Textures on skin layer surface and core material cross-section | | | Hardness ratio | Skin layer | |
|---|---|---|---|---|---|---|---|
| | | Grain size ratio (a/b) of skin layer and core material | Grain size (a) on skin layer surface | Grain size (b) on core material normal cross section | Axial direction grain size ratio (d/c) | (SH/CH) of skin layer and core material | Main component | Thickness/ μm |
| Examples | 1 | 0.45 | 1.5 | 3.3 | 0.8 | 1.5 | Pd | 0.01 |
| | 2 | 0.31 | 1.1 | 3.5 | 2.0 | 1.8 | Pd | 0.06 |
| | 3 | 0.29 | 1.0 | 3.5 | 4.2 | 2.6 | Pd | 0.03 |
| | 4 | 0.20 | 0.8 | 4.0 | 6.8 | 3.0 | Pd | 0.09 |
| | 5 | 0.13 | 0.6 | 4.5 | 21.4 | 2.1 | Pd | 0.05 |
| | 6 | 0.10 | 0.5 | 5.0 | 52.5 | 3.3 | Pd | 0.32 |
| | 7 | 0.03 | 0.2 | 7.0 | 87 | 4.3 | Pd | 0.24 |
| | 8 | 0.002 | 0.02 | 8.2 | 420 | 13.5 | Pd | 0.28 |
| | 9 | 0.32 | 2.0 | 6.3 | 1.7 | 1.7 | Pd | 0.18 |
| | 10 | 0.68 | 3.4 | 5.0 | 0.9 | 0.9 | Pd | 0.006 |
| | 11 | 0.48 | 1.2 | 2.5 | 2.6 | 1.5 | Pd | 0.02 |
| | 12 | 0.67 | 1.2 | 1.8 | 1.0 | 1.2 | Pd | 0.13 |
| | 13 | 0.19 | 0.7 | 3.7 | 1.5 | 3.6 | Pt | 0.08 |
| | 14 | 0.31 | 0.8 | 2.6 | 32.5 | 2.1 | Pt | 0.15 |
| | 15 | 0.26 | 0.5 | 1.9 | 71.3 | 2.3 | Pt | 0.004 |
| | 16 | 0.45 | 1.7 | 3.8 | 1.2 | 2.5 | Ru | 0.10 |
| | 17 | 0.02 | 0.05 | 2.7 | 4 | 6.4 | Ru | 0.06 |
| | 18 | 0.52 | 5.8 | 11.2 | 8 | 1.3 | Rh | 0.007 |
| | 19 | 0.44 | 1.2 | 2.7 | 1.8 | 1.5 | Pd | 0.04 |
| | 20 | 0.18 | 0.9 | 5.0 | 12.1 | 4.4 | Pd | 0.18 |
| | 21 | 0.60 | 0.3 | 0.5 | 2.3 | 1.2 | Pd | 0.09 |
| | 22 | 0.61 | 2.5 | 4.1 | 1.0 | 1.4 | Pt | 0.03 |
| | 23 | 0.10 | 0.5 | 5.0 | 5.4 | 3.9 | Ru | 0.07 |
| | 24 | 0.26 | 0.7 | 2.7 | 1.3 | 1.8 | Rh | 0.03 |
| | 25 | 0.14 | 0.7 | 5.0 | 3.5 | 2.7 | Pd | 0.015 |
| | 26 | 0.03 | 0.2 | 7.0 | 0.8 | 5.2 | Pd | 0.16 |
| | 27 | 0.32 | 2.0 | 6.3 | 3.0 | 2.1 | Ru | 0.06 |
| | 28 | 0.33 | 0.6 | 1.8 | 2.1 | 2.4 | Pd | 0.06 |

TABLE 1-continued

|  |  | (col A) | (col B) | (col C) | (col D) | (col E) | (col F) | (col G) |
|---|---|---|---|---|---|---|---|---|
|  | 29 | 0.25 | 0.2 | 0.8 | 1.7 | 3.2 | Pt | 0.15 |
|  | 30 | 0.50 | 2.5 | 5.0 | 2.3 | 1.3 | Ru | 0.01 |
|  | 31 | 0.21 | 2.5 | 12 | 5.5 | 2.3 | Pd | 0.12 |
|  | 32 | 0.27 | 0.9 | 3.3 | 1.5 | 1.6 | Ag | 0.22 |
|  | 33 | 0.64 | 2.5 | 3.9 | 1.8 | 1.4 | Ag | 0.1 |
|  | 34 | 0.34 | 1.2 | 3.5 | 2.5 | 1.7 | Pd | 0.01 |
|  | 35 | 0.28 | 4.8 | 17 | 4.6 | 4.4 | Pd | 0.14 |
|  | 36 | 0.18 | 1.3 | 7.3 | 2.7 | 2.9 | Pd | 0.08 |
|  | 37 | 0.19 | 0.8 | 4.2 | 1.0 | 1.1 | Ag | 0.03 |
|  | 38 | 0.09 | 0.4 | 4.5 | 1.7 | 1.5 | Ag | 0.09 |
|  | 39 | 0.08 | 0.2 | 2.5 | 1.1 | 1.3 | Pd | 0.06 |
|  | 40 | 0.09 | 0.6 | 7.0 | 2.2 | 2.2 | Pd | 0.07 |
| Comparative Examples | 1 | 0.71 | 1.5 | 2.1 | 1.8 | 1.5 | Pt | 0.02 |
|  | 2 | 0.72 | 3.8 | 5.3 | 0.2 | 1.3 | Pd | 0.06 |
|  | 3 | 0.93 | 1.4 | 1.5 | 1.6 | 1.0 | Pd | 0.01 |
|  | 4 | 0.81 | 0.3 | 0.5 | 0.7 | 1.2 | Ru | 0.2 |
|  | 5 | 1.33 | 0.4 | 0.3 | 1.5 | 0.5 | Pd | 0.25 |
|  | 6 | 0.80 | 1.2 | 1.5 | 2.2 | 1.1 | Pt | 0.1 |

|  |  | Core material | | | Intermediate metal layer | | Production method (A: electroless, B: electro, C: evapo, D: melt) | Processing rate |
|---|---|---|---|---|---|---|---|---|
|  |  | Main component | Doped element (mass · ppm) | Diffusion layer | Main component | Thickness/ μm | | |
| Examples | 1 | Cu | — | ○ | — | — | A | R2 |
|  | 2 | Cu | P30 | ○ | — | — | B | R1 |
|  | 3 | Cu | — | ○ | — | — | B | R3 |
|  | 4 | Cu | — | ○ | — | — | B | R2 |
|  | 5 | Cu | — | ○ | — | — | B | R2 |
|  | 6 | Cu | — | ○ | — | — | A | R3 |
|  | 7 | Cu | — | ○ | — | — | B | R2 |
|  | 8 | Cu | Zr25 | ○ | — | — | B | R2 |
|  | 9 | Cu | B8 | ○ | — | — | D | R1 |
|  | 10 | Cu | — | ○ | — | — | B | R1 |
|  | 11 | Cu | — | ○ | — | — | B | R3 |
|  | 12 | Cu | Pd1000 | ○ | — | — | C | R2 |
|  | 13 | Cu | — | ○ | — | — | A | R4 |
|  | 14 | Cu | — | ○ | — | — | B | R2 |
|  | 15 | Cu | — | X | — | — | B | R1 |
|  | 16 | Cu | — | ○ | — | — | B | R2 |
|  | 17 | Cu | Be10 | ○ | — | — | A | R1 |
|  | 18 | Cu | — | ○ | — | — | B | R2 |
|  | 19 | Au | Be15 | ○ | — | — | B | R3 |
|  | 20 | Au | Pd8000 | ○ | — | — | D | R1 |
|  | 21 | Au | — | ○ | — | — | B | R2 |
|  | 22 | Au | Ca20 Ni10 | X | — | — | C | R4 |
|  | 23 | Au | — | ○ | — | — | B | R1 |
|  | 24 | Ag | — | ○ | — | — | B | R3 |
|  | 25 | Cu | B25 | ○ | Au | 0.08 | B | R2 |
|  | 26 | Cu | — | ○ | Au | 0.03 | B | R1 |
|  | 27 | Cu | P20 | ○ | Pd | 0.02 | B | R1 |
|  | 28 | Cu | — | ○ | Pt | 0.03 | B | R3 |
|  | 29 | Au | — | ○ | Pd | 0.12 | B | R2 |
|  | 30 | Au | Ca15 | ○ | Pd | 0.005 | B | R3 |
|  | 31 | Au | Pt3000 | ○ | — | — | B | R2 |
|  | 32 | Au | Pd2000, Ca25 | ○ | — | — | B | R2 |
|  | 33 | Cu | — | ○ | — | — | B | R4 |
|  | 34 | Cu | In20, Bi10 | ○ | — | — | B | R4 |
|  | 35 | Cu | Ag250 | ○ | — | — | B | R3 |
|  | 36 | Cu | Pd180 | ○ | — | — | B | R4 |
|  | 37 | Cu | Pd7500 | ○ | Au | 0.03 | B | R4 |
|  | 38 | Cu | Pd1000, B15 | ○ | — | — | B | R4 |
|  | 39 | Cu | Pd9800, Ag50 | ○ | — | — | B | R4 |
|  | 40 | Cu | B5, Pd2000 | ○ | — | — | B | R4 |
| Comparative Examples | 1 | Cu | — | X | — | — | C | R3 |
|  | 2 | Cu | — | X | — | — | B | R4 |
|  | 3 | Cu | — | X | — | — | A | R3 |
|  | 4 | Cu | — | ○ | — | — | B | R1 |
|  | 5 | Au | — | ○ | — | — | B | R2 |
|  | 6 | Au | — | ○ | — | — | B | R2 |

TABLE 2

| | | Leaning property | reverse bonding | Bending propert at different-level | | Different-level reverse bonding at overhang type stacking | | Neck damage at low loop | | Looping stability | |
|---|---|---|---|---|---|---|---|---|---|---|---|
| | | | | Bending property | Bump height | 90 μm height | 70 μm height | Linearity | Height dispersion | | |
| Examples | 1 | ○ | ◎ | ○ | ○ | ◎ | ○ | △ | ○ | | |
| | 2 | ○ | ◎ | ○ | ○ | ◎ | ○ | ◎ | ○ | | |
| | 3 | ◎ | ◎ | ○ | ○ | ◎ | ○ | ◎ | ◎ | | |
| | 4 | ◎ | ◎ | ○ | ○ | ◎ | ◎ | ◎ | ◎ | | |
| | 5 | ◎ | ◎ | ○ | ○ | ◎ | ◎ | ◎ | ◎ | | |
| | 6 | ◎ | ◎ | ○ | ○ | ◎ | ◎ | ◎ | ◎ | | |
| | 7 | ◎ | ◎ | ○ | ○ | ◎ | ◎ | ◎ | ◎ | | |
| | 8 | ◎ | ◎ | ○ | ○ | ◎ | ◎ | ◎ | ◎ | | |
| | 9 | ○ | ○ | ○ | ○ | ◎ | ◎ | ○ | ○ | | |
| | 10 | ○ | ○ | ○ | ○ | ◎ | ◎ | △ | △ | | |
| | 11 | ○ | ◎ | ○ | ○ | ◎ | ○ | ◎ | ○ | | |
| | 12 | ○ | ◎ | ◎ | ◎ | ○ | △ | △ | △ | | |
| | 13 | ◎ | ◎ | ○ | ○ | ◎ | ○ | ○ | ◎ | | |
| | 14 | ○ | ◎ | ○ | ○ | ◎ | ○ | ◎ | ◎ | | |
| | 15 | ◎ | ◎ | ○ | ○ | ○ | △ | ◎ | ◎ | | |
| | 16 | ○ | ○ | ○ | ○ | ◎ | ○ | ○ | ◎ | | |
| | 17 | ◎ | ◎ | ○ | ○ | ◎ | ○ | ◎ | ◎ | | |
| | 18 | ○ | ○ | ○ | ○ | ◎ | ◎ | ◎ | ○ | | |
| | 19 | ○ | ◎ | ○ | ○ | ◎ | ○ | ○ | ○ | | |
| | 20 | ◎ | ◎ | ○ | ○ | ◎ | ◎ | ◎ | ◎ | | |
| | 21 | ○ | ◎ | ○ | ○ | ○ | △ | ◎ | △ | | |
| | 22 | ○ | ○ | ○ | ○ | ◎ | ◎ | △ | ○ | | |
| | 23 | ◎ | ◎ | ○ | ○ | ◎ | ◎ | ◎ | ◎ | | |
| | 24 | ◎ | ◎ | ○ | ○ | ◎ | ○ | ○ | ○ | | |
| | 25 | ◎ | ◎ | ○ | ○ | ◎ | ◎ | ◎ | ◎ | | |
| | 26 | ◎ | ◎ | ○ | ○ | ◎ | ◎ | △ | ◎ | | |
| | 27 | ○ | ○ | ○ | ○ | ◎ | ◎ | ◎ | ◎ | | |
| | 28 | ○ | ◎ | ○ | ○ | ○ | △ | ◎ | ◎ | | |
| | 29 | ◎ | ◎ | ○ | ○ | ○ | △ | ○ | ◎ | | |
| | 30 | ○ | ○ | ○ | ○ | ◎ | ◎ | ◎ | ○ | | |
| | 31 | ◎ | ○ | ○ | ○ | ◎ | ◎ | ◎ | ◎ | | |
| | 32 | ◎ | ◎ | ○ | ○ | ◎ | ○ | ○ | ○ | | |
| | 33 | ○ | ○ | ○ | ○ | ◎ | ○ | ○ | ○ | | |
| | 34 | ○ | ◎ | ○ | ○ | ◎ | ○ | ◎ | ◎ | | |
| | 35 | ◎ | ○ | ○ | ○ | ◎ | ◎ | ◎ | ◎ | | |
| | 36 | ◎ | ◎ | ◎ | ○ | ◎ | ◎ | ◎ | ◎ | | |
| | 37 | ◎ | ◎ | ◎ | ◎ | ◎ | ◎ | △ | △ | | |
| | 38 | ◎ | ◎ | ◎ | ◎ | ◎ | ◎ | ○ | ○ | | |
| | 39 | ◎ | ◎ | ◎ | ◎ | ◎ | ○ | △ | ○ | | |
| | 40 | ◎ | ◎ | ◎ | ◎ | ◎ | ◎ | ◎ | ◎ | | |
| Comparative Examples | 1 | X | △ | X | △ | ○ | △ | △ | △ | | |
| | 2 | X | X | X | △ | ○ | ○ | X | △ | | |
| | 3 | X | △ | X | △ | △ | X | △ | X | | |
| | 4 | X | ○ | X | △ | △ | X | X | X | | |
| | 5 | X | ○ | △ | △ | △ | X | △ | X | | |
| | 6 | X | △ | △ | △ | △ | X | ○ | X | | |

| | | Linearity at short span & low loop | Spring characteristic | Wedge bondability | Peel bonding strength (25 μmφ, span 3 mm) | Drawing processability | | Chip damage |
|---|---|---|---|---|---|---|---|---|
| | | | | | | 25 μm | 17 μm | |
| Examples | 1 | ○ | △ | ○ | ○ | ◎ | ◎ | ◎ |
| | 2 | ◎ | ◎ | ○ | ○ | ◎ | ◎ | ◎ |
| | 3 | ○ | ◎ | ◎ | ○ | ◎ | ◎ | ◎ |
| | 4 | ○ | ◎ | ◎ | ○ | ◎ | ◎ | ◎ |
| | 5 | ○ | ◎ | ◎ | ○ | ◎ | ◎ | ◎ |
| | 6 | ○ | ◎ | ◎ | ○ | ◎ | ◎ | △ |
| | 7 | ○ | ◎ | ◎ | ○ | ◎ | ◎ | ◎ |
| | 8 | ◎ | ◎ | ◎ | ○ | ◎ | ◎ | ◎ |
| | 9 | ◎ | ○ | ○ | ○ | ◎ | ◎ | ◎ |
| | 10 | ○ | △ | △ | ○ | ◎ | ○ | ◎ |
| | 11 | ○ | ◎ | ○ | ○ | ◎ | ◎ | ◎ |
| | 12 | ○ | △ | △ | ○ | ◎ | ○ | ◎ |
| | 13 | ○ | ○ | ◎ | ○ | ◎ | ◎ | ◎ |
| | 14 | ◎ | ◎ | ◎ | ○ | ◎ | ◎ | ◎ |
| | 15 | ○ | ○ | ○ | ○ | ◎ | △ | ◎ |
| | 16 | ○ | ◎ | ◎ | ○ | ◎ | ◎ | ◎ |
| | 17 | ◎ | ◎ | ◎ | ○ | ◎ | ◎ | ◎ |
| | 18 | ◎ | ◎ | ○ | ○ | ◎ | ◎ | ◎ |
| | 19 | ◎ | ○ | ○ | ○ | ◎ | ◎ | ◎ |

TABLE 2-continued

|  | | | | | | | | |
|---|---|---|---|---|---|---|---|---|
|  | 20 | ◎ | ◎ | ◎ | ○ | ◎ | ◎ | ◎ |
|  | 21 | ○ | ◎ | △ | ○ | ◎ | ○ | ◎ |
|  | 22 | ◎ | △ | ○ | ○ | ○ | △ | ◎ |
|  | 23 | ○ | ◎ | ◎ | ○ | ◎ | ◎ | ◎ |
|  | 24 | ◎ | ○ | ○ | ○ | ◎ | ◎ | ◎ |
|  | 25 | ◎ | ◎ | ◎ | ◎ | ◎ | ◎ | ◎ |
|  | 26 | ○ | △ | ◎ | ◎ | ◎ | ◎ | ◎ |
|  | 27 | ◎ | ◎ | ◎ | ◎ | ◎ | ◎ | ◎ |
|  | 28 | ○ | ◎ | ◎ | ◎ | ◎ | ◎ | ◎ |
|  | 29 | ○ | ○ | ◎ | ◎ | ◎ | ◎ | ◎ |
|  | 30 | ◎ | ◎ | ○ | ◎ | ◎ | ◎ | ◎ |
|  | 31 | ◎ | ◎ | ◎ | ○ | ◎ | ◎ | ◎ |
|  | 32 | ◎ | ◎ | ○ | ○ | ◎ | ◎ | ◎ |
|  | 33 | ○ | ○ | ○ | ○ | ◎ | ◎ | ◎ |
|  | 34 | ◎ | ◎ | ○ | ○ | ◎ | ◎ | ◎ |
|  | 35 | ◎ | ◎ | ◎ | ○ | ◎ | ◎ | ◎ |
|  | 36 | ◎ | ◎ | ◎ | ○ | ◎ | ◎ | ◎ |
|  | 37 | ○ | △ | △ | ◎ | ◎ | ○ | ◎ |
|  | 38 | ○ | ○ | ○ | ○ | ◎ | ◎ | ◎ |
|  | 39 | ○ | △ | ○ | ○ | ◎ | ◎ | ○ |
|  | 40 | ○ | ◎ | ◎ | ○ | ◎ | ◎ | ◎ |
| Compara-<br>tive<br>Examples | 1 | X | △ | △ | △ | △ | X | ◎ |
|  | 2 | X | X | △ | △ | △ | X | ◎ |
|  | 3 | X | △ | X | △ | △ | X | ◎ |
|  | 4 | X | X | X | △ | △ | X | ○ |
|  | 5 | △ | △ | X | △ | △ | X | X |
|  | 6 | △ | ○ | X | △ | △ | X | ◎ |

A bonding wire according to the first aspect corresponds to the examples 1 to 40; a bonding wire according to the second aspect corresponds to the examples 1 to 8, 11 to 15, 17, 19 to 21, 23 to 26, 28, 29, 32, 34, and 36 to 40; a bonding wire according to the third aspect corresponds to the examples 1 to 11, 13, 14, 16 to 20, 22 to 27, and 30 to 40; a bonding wire according to the fourth aspect corresponds to the examples 2 to 9, 11, 13 to 21, 23 to 25, 27 to 36, 38, and 40; a bonding wire according to the fifth aspect corresponds to the examples 1 to 9, 11, 13 to 20, 22 to 36, and 38 to 40; a bonding wire according to the sixth aspect corresponds to the examples 1 to 5, 7 to 14, and 16 to 40; a bonding wire according to the seventh aspect corresponds to the examples 1 to 17, 19 to 23, and 25 to 40; a bonding wire according to the eighth aspect corresponds to the examples 1 to 23, and 25 to 40; a bonding wire according to the ninth aspect corresponds to the examples 25 to 30, and 37; a bonding wire according to the tenth aspect corresponds to the examples 1 to 14, 16 to 21, and 23 to 40; a bonding wire according to the eleventh aspect corresponds to the examples 2, 8, 9, 25, 27, and 34 to 36; a bonding wire according to the twelfth aspect corresponds to the examples 12, and 36 to 40; and a bonding wire according to the thirteenth aspect corresponds to the examples 19, 20, 22, and 30 to 32. The comparative examples 1 to 6 show the results that do not satisfy the first aspect.

Part of the evaluation results for the representative examples of the respective aspects will be explained.

A multilayer-structured bonding wire corresponding to the examples 1 to 40, which is in accordance with the present invention, comprises an average size (a) of crystal grains in the skin layer on a wire surface along a wire circumferential direction and an average size (b) of crystal grains in the core material on a normal cross section which is a cross section normal to a wire axis, wherein a relationship between the average size (a) and the average size (b) satisfies the inequality of $a/b \leq 0.7$. For this reason, it was confirmed that the leaning property at a wire diameter of 25 μm was good. On the other hand, with the comparative examples 1 to 6 which relates to a multilayer wire having the ratio a/b greater than 0.7, it was confirmed that leaning failure occurred frequently. As preferred cases, with the examples 3 to 8, 13, 15, 17, 20, 23 to 26, 29, 31, 32, and 35 to 40 where the inequality of $a/b \leq 0.3$ was satisfied, it was confirmed that the leaning property at a wire diameter of 25 μm was improved furthermore.

A multilayer-structured bonding wire corresponding to the examples 1 to 8, 11 to 15, 17, 19 to 21, 23 to 26, 28, 29, 32, 34, and 36 to 40, which is in accordance with the present invention, satisfies simultaneously the inequalities of $a/b \leq 0.7$ and $a \leq 1.5$ μm relating to the average crystal grain sizes (a) and (b) of the skin layer and the core material. For this reason, it was confirmed that the bending property of the wire at the time of different-level reverse bonding at a wire diameter of 25 μm was good.

A multilayer-structured bonding wire corresponding to the examples 1 to 11, 13, 14, 16 to 20, 22 to 27, and 30 to 40, which is in accordance with the present invention, satisfies simultaneously the inequalities of $a/b \leq 0.7$ and $b \geq 2$ μm relating to the average crystal grain sizes (a) and (b) of the skin layer and the core material. For this reason, it was confirmed that the neck damage was suppressed at low loop where the loop height was approximately 90 μm. Preferably, with the examples 4 to 10, 18, 20, 22, 23, 25 to 27, 30, 31, 35 to 38, and 40 where the inequality $b \geq 4$ μm is satisfied, it was confirmed that the neck damage was suppressed even at ultralow loop where the loop height was approximately 70 μm and thus, excellent low loop performance was given.

A multilayer-structured bonding wire corresponding to the examples 2 to 9, 11, 13 to 21, 23 to 25, 27 to 36, 38, and 40, which is in accordance with the present invention, satisfies the aforementioned crystal grain size ratio of $a/b \leq 0.7$ and furthermore, a relationship between an average size (c) of the crystal grains in the skin layer on the wire surface along a wire axis direction and an average size (d) of the crystal grains in the core material along the wire axis direction satisfies an inequality of $d/c \geq 1.2$. For this reason, it was confirmed that the spring failure was reduced and moreover, the loop shape linearity was also improved. Preferably, with the examples 2 to 8, 11, 14, 15, 17, 18, 20, 21, 23, 25, 27, 28, 30, 31, 34 to 36, and 40 where the inequality $d/c \geq 2$ is satisfied, it was confirmed that both the spring failure and the loop shape linearity were improved furthermore and thus, excellent properties suitable for stacked chip bonding were obtained.

A multilayer-structured bonding wire corresponding to the examples 1 to 9, 11, 13 to 20, 22 to 36, and 38 to 40, which is in accordance with the present invention, satisfies the aforementioned crystal grain size ratio of a/b≦0.7 and furthermore, a relationship between a hardness SH on the surface of the skin layer and a hardness CH on the cross section of the core material satisfies an inequality of SH/CH≧1.3. For this reason, it was confirmed that an effect of improving the wedge bondability and an effect of reducing the loop height dispersion were simultaneously realized. Preferably, with the examples 3 to 8, 13 to 17, 20, 23, 25 to 29, 31, 35, 36, and 40 where SH/CH≧2.0 is satisfied, it was confirmed that further excellent properties were obtained in both the wedge bondability improvement and the suppression in loop height dispersion.

A multilayer structured bonding wire corresponding to the examples 25 to 30, and 37, which is in accordance with the present invention, satisfies the aforementioned crystal grain size ratio of a/b≦0.7 and furthermore, an intermediate metal layer is provided between the skin layer and the core material. For this reason, it was confirmed that the peel strength at a wedge bonded portion was increased.

A multilayer-structured bonding wire corresponding to the examples 1 to 5, 7 to 14, and 16 to 40, which is in accordance with the present invention, comprises the skin layer having a thickness of 0.005 to 0.3 μm. For this reason, it was confirmed that in addition to the improvement in leaning failure and spring failure, the required properties, such as the bondability, loop control, and the like could be comprehensively satisfied easily, and the chip damage was satisfactorily decreased. In comparison with this, it was confirmed that the thickness of the skin layer exceeded 0.3 μm in the example 6 and therefore, the chip damage increased, and that the thickness of the skin layer was less than 0.005 μm in the example 15 and therefore, it was susceptible to spring failure and deterioration in wedge bondability.

A multilayer-structured bonding wire corresponding to the examples 1 to 14, 16 to 21, and 23 to 40, which is in accordance with the present invention, comprises a diffusion layer having a concentration gradient provided between the skin layer and the core material. For this reason, it was confirmed that the wiredrawing processing property for the wire diameter up to 25 μm was good. With the examples 1 to 9, 11, 13, 14, 16 to 20, 23 to 36, and 38 to 40 as preferred cases, because the diffusion layer was provided and SH/CH≧1.3 was satisfied, it was confirmed that the wiredrawing processing property for the thinner wire diameter up to 17 μm was good.

A multilayer-structured bonding wire corresponding to the examples 2, 8, 9, 25, 27, and 34 to 36, which is in accordance with the present invention, comprises Cu as the main component constituting the core material, and the core material contains one or more of In, Ca, B, Pd, Bi, Zr, Ag, and P in a range of 5 to 300 ppm. For this reason, it was confirmed that the linearity at short span and low loop was improved. Similarly, the examples 19, 20, 22, and 30 to 32, which are in accordance with the present invention, comprise Au as the main component constituting the core material, and the core material contains at least one of Be, Ca, Ni, Pd, and Pt in a range of 5 to 9500 ppm. For this reason, it was confirmed that the linearity at short span and low loop was improved.

A multilayer-structured bonding wire corresponding to the examples 12, and 36 to 40, which is in accordance with the present invention, comprises Cu as the main component constituting the core material and Pd or Ag as the main component of the skin layer, and contains Pd in a range of 5 to 10000 ppm. For this reason, it was confirmed that the bending property at overhang type stacked chip reverse bonding was improved. Preferably, with the examples 12, and 37 to 40, since the Pd concentration was in the range of 200 to 10000 ppm, a high effect of improving the bump height at overhang type stacked chip reverse bonding was confirmed. Moreover, since the Pd concentration was in the range of 5 to 8000 ppm in the examples 12, 36 to 38, and 40, it was confirmed that chip damage was suppressed. On the other hand, since the Pd concentration exceeded 8000 ppm in the example 39, it was confirmed that chip damage increased.

The examples 41 to 80 shown in Table 3 correspond to bonding wires with a diameter of 20 μm or less according to the present invention. The evaluation results for the leaning property and the wire bending property at different-level reverse bonding chosen from the performance in use of a bonding wire are shown. However, it was confirmed that good properties which were able to be used in practice were also obtained in the remainder of the performance in use.

A multilayer-structured bonding wire corresponding to the examples 41 to 80, which is in accordance with the present invention, comprises the average size (a) of crystal grains in the skin layer on its surface along the wire circumferential direction and the average size (b) of crystal grains in the core material on the normal cross section which is normal to the wire axis, wherein a relationship between the average size (a) and the average size (b) satisfies the inequality of a/b≦0.7. For this reason, it was confirmed that the leaning property was good. Moreover, as preferred cases, a multilayer-structured bonding wire corresponding to the examples 46 to 48, 57, 63, 66, and 78 to 80, which is in accordance with the present invention, satisfies the inequality of a/b≦0.1, wherein the leaning property at a wire diameter of 20 μm or less was improved furthermore, and therefore, an excellent property was confirmed.

A multilayer-structured bonding wire corresponding to the examples 43 to 48, 53 to 55, 57, 60, 61, 63 to 66, 68, 69, 72, and 77 to 80, which is in accordance with the present invention, satisfies simultaneously the inequalities of a/b≦0.7 and of a≦1 μm relating to the average crystal grain sizes (a) and (b) of the skin layer and the core material. For this reason, it was confirmed that the bending property at a wire diameter of 20 μm or less at different-level reverse bonding was good.

TABLE 3

| | | Textures on skin layer surface and core material cross-section | | | Hardness ratio | Skin layer | | | Core material | |
| --- | --- | --- | --- | --- | --- | --- | --- | --- | --- | --- |
| | | Grain size ratio (a/b) of skin layer and core material | Grain size (a) on skin layer surface | Grain size (b) on core material normal cross section | Axial direction grain size ratio (d/c) | (SH/CH) of skin layer and core material | Main component | Thickness/ μm | Diffusion layer | Main component | Doped element (mass · ppm) |
| Examples | 41 | 0.42 | 1.4 | 3.3 | 0.8 | 1.4 | Pd | 0.01 | ○ | Cu | — |
| | 42 | 0.30 | 1.1 | 3.7 | 2.0 | 1.8 | Pd | 0.06 | ○ | Cu | P30 |
| | 43 | 0.29 | 1.0 | 3.4 | 4.2 | 2.6 | Pd | 0.04 | ○ | Cu | — |

TABLE 3-continued

| | | | | | | | | | | |
|---|---|---|---|---|---|---|---|---|---|---|
| 44 | 0.20 | 0.8 | 4.0 | 6.8 | 2.9 | Pd | 0.09 | ○ | Cu | — |
| 45 | 0.15 | 0.7 | 4.8 | 22 | 2.1 | Pd | 0.05 | ○ | Cu | — |
| 46 | 0.10 | 0.5 | 5.1 | 51 | 3.1 | Pd | 0.31 | ○ | Cu | — |
| 47 | 0.03 | 0.2 | 6.8 | 85 | 4.1 | Pd | 0.25 | ○ | Cu | — |
| 48 | 0.002 | 0.02 | 8.4 | 415 | 13.5 | Pd | 0.28 | ○ | Cu | Zr25 |
| 49 | 0.32 | 2.0 | 6.3 | 1.7 | 1.7 | Pd | 0.18 | ○ | Cu | B8 |
| 50 | 0.65 | 3.3 | 5.1 | 0.9 | 0.9 | Pd | 0.005 | ○ | Cu | — |
| 51 | 0.48 | 1.2 | 2.5 | 2.5 | 1.6 | Pd | 0.02 | ○ | Cu | — |
| 52 | 0.72 | 1.3 | 1.8 | 1.0 | 1.3 | Pd | 0.14 | ○ | Cu | Pd1000 |
| 53 | 0.18 | 0.7 | 3.9 | 1.5 | 3.8 | Pt | 0.08 | ○ | Cu | — |
| 54 | 0.32 | 0.8 | 2.5 | 33 | 2.1 | Pt | 0.15 | ○ | Cu | — |
| 55 | 0.26 | 0.5 | 1.9 | 73 | 2.4 | Pt | 0.004 | X | Cu | — |
| 56 | 0.45 | 1.7 | 3.8 | 1.2 | 2.6 | Ru | 0.10 | ○ | Cu | — |
| 57 | 0.02 | 0.05 | 2.8 | 4 | 6.3 | Ru | 0.06 | ○ | Cu | Be10 |
| 58 | 0.51 | 5.8 | 11.4 | 8 | 1.3 | Rh | 0.007 | ○ | Cu | — |
| 59 | 0.44 | 1.2 | 2.7 | 1.7 | 1.6 | Pd | 0.04 | ○ | Au | Be15 |
| 60 | 0.18 | 0.9 | 4.9 | 12.4 | 4.5 | Pd | 0.17 | ○ | Au | Pd8000 |
| 61 | 0.80 | 0.4 | 0.5 | 2.5 | 1.2 | Pd | 0.09 | ○ | Au | — |
| 62 | 0.61 | 2.5 | 4.1 | 1.0 | 1.4 | Pt | 0.03 | X | Au | Ca20 Ni10 |
| 63 | 0.10 | 0.5 | 5.0 | 5.4 | 3.7 | Ru | 0.06 | ○ | Au | — |
| 64 | 0.26 | 0.7 | 2.7 | 1.3 | 1.8 | Rh | 0.03 | ○ | Aq | — |
| 65 | 0.17 | 0.8 | 4.8 | 3.5 | 2.6 | Pd | 0.015 | ○ | Cu | B25 |
| 66 | 0.03 | 0.2 | 6.9 | 0.8 | 4.3 | Pd | 0.16 | ○ | Cu | — |
| 67 | 0.32 | 2.0 | 6.3 | 2.9 | 2.1 | Ru | 0.07 | ○ | Cu | P20 |
| 68 | 0.35 | 0.6 | 1.7 | 2.1 | 2.5 | Pd | 0.06 | ○ | Cu | — |
| 69 | 0.25 | 0.2 | 0.8 | 1.7 | 3.2 | Pt | 0.15 | ○ | Au | — |
| 70 | 0.50 | 2.4 | 4.8 | 2.3 | 1.4 | Ru | 0.01 | ○ | Au | Ca15 |
| 71 | 0.21 | 2.5 | 12 | 5.3 | 2.3 | Pd | 0.12 | ○ | Au | Pt3000 |
| 72 | 0.28 | 0.9 | 3.2 | 1.5 | 1.7 | Ag | 0.22 | ○ | Au | Pd2000, Ca25 |
| 73 | 0.66 | 2.5 | 3.8 | 1.7 | 1.5 | Ag | 0.1 | ○ | Cu | — |
| 74 | 0.36 | 1.3 | 3.6 | 1.3 | 1.7 | Pd | 0.01 | ○ | Cu | In20, Bi10 |
| 75 | 0.28 | 4.7 | 17 | 4.4 | 4.5 | Pd | 0.14 | ○ | Cu | Ag250 |
| 76 | 0.18 | 1.3 | 7.3 | 2.6 | 2.9 | Pd | 0.08 | ○ | Cu | Pd180 |
| 77 | 0.18 | 0.7 | 4.0 | 1.0 | 1.1 | Ag | 0.03 | ○ | Cu | Pd7500 |
| 78 | 0.09 | 0.4 | 4.4 | 1.6 | 1.4 | Ag | 0.09 | ○ | Cu | Pd1000, B15 |
| 79 | 0.08 | 0.2 | 2.6 | 1.1 | 1.5 | Pd | 0.06 | ○ | Cu | Pd9800, Ag50 |
| 80 | 0.09 | 0.6 | 7.0 | 2.3 | 2.2 | Pd | 0.07 | ○ | Cu | B5, Pd2000 |

| | | Intermediate metal layer | | Production method (A: electroless, B: electro, C: evapo, D: melt) | Diameter/ μm | Processing rate | Leaning property | Bending property at different-level reverse bonding |
|---|---|---|---|---|---|---|---|---|
| | | Main component | Thickness/ μm | | | | | |
| Examples | 41 | — | — | A | 20 | R2 | ○ | ○ |
| | 42 | — | — | B | 18 | R2 | ○ | ○ |
| | 43 | — | — | B | 20 | R3 | ○ | ◉ |
| | 44 | — | — | B | 20 | R2 | ○ | ◉ |
| | 45 | — | — | B | 20 | R2 | ○ | ◉ |
| | 46 | — | — | A | 20 | R3 | ◉ | ◉ |
| | 47 | — | — | B | 13 | R4 | ◉ | ◉ |
| | 48 | — | — | B | 20 | R2 | ◉ | ◉ |
| | 49 | — | — | D | 15 | R2 | ○ | Δ |
| | 50 | — | — | B | 20 | R1 | ○ | Δ |
| | 51 | — | — | B | 20 | R3 | ○ | ○ |
| | 52 | — | — | C | 17 | R2 | ○ | ○ |
| | 53 | — | — | A | 20 | R4 | ○ | ◉ |
| | 54 | — | — | B | 20 | R2 | ○ | ◉ |
| | 55 | — | — | B | 20 | R1 | ○ | ◉ |
| | 56 | — | — | B | 20 | R2 | ○ | Δ |
| | 57 | — | — | A | 20 | R1 | ◉ | ◉ |
| | 58 | — | — | B | 20 | R3 | ○ | Δ |
| | 59 | — | — | B | 15 | R4 | ○ | ○ |
| | 60 | — | — | D | 20 | R2 | ○ | ◉ |
| | 61 | — | — | B | 20 | R2 | ○ | ◉ |
| | 62 | — | — | C | 20 | R4 | ○ | Δ |
| | 63 | — | — | B | 20 | R2 | ◉ | ◉ |
| | 64 | — | — | B | 20 | R3 | ○ | ◉ |
| | 65 | Au | 0.08 | B | 20 | R2 | ○ | ◉ |
| | 66 | Au | 0.03 | B | 15 | R3 | ◉ | ◉ |
| | 67 | Pd | 0.02 | B | 20 | R1 | ○ | Δ |
| | 68 | Pt | 0.03 | B | 20 | R4 | ○ | ◉ |
| | 69 | Pd | 0.12 | B | 20 | R2 | ○ | ◉ |
| | 70 | Pd | 0.005 | B | 20 | R3 | ○ | Δ |
| | 71 | — | — | B | 17 | R2 | ○ | Δ |
| | 72 | — | — | B | 20 | R2 | ○ | ◉ |
| | 73 | — | — | B | 20 | R4 | ○ | Δ |
| | 74 | — | — | B | 15 | R4 | ○ | ○ |
| | 75 | — | — | B | 20 | R3 | ○ | Δ |

TABLE 3-continued

| | | | | | | | |
|---|---|---|---|---|---|---|---|
| 76 | — | — | B | 17 | R4 | ○ | ○ |
| 77 | Au | 0.03 | B | 15 | R4 | ○ | ⊚ |
| 78 | — | — | B | 20 | R4 | ⊚ | ⊚ |
| 79 | — | — | B | 15 | R4 | ⊚ | ⊚ |
| 80 | — | — | B | 12 | R4 | ⊚ | ⊚ |

The invention claimed is:

1. A bonding wire for a semiconductor device comprising:
a core material made of a metal containing at least one of Cu, Au and Ag as a main component; and
a skin layer formed on the core material and containing a metal different from the core material as a main component, said metal being at least one of Pd, Pt, Ru, Rh and Ag,
wherein a relationship between an average size (a) of crystal grains in the skin layer on a wire surface along a wire circumferential direction and an average size (b) of crystal grains in the core material on a normal cross section, said normal cross section being a cross section normal to a wire axis, satisfies an inequality of $a/b \leqq 0.7$.

2. The bonding wire for a semiconductor device according to claim 1, wherein the average size (a) is 1.5 μm or less.

3. The bonding wire for a semiconductor device according to claim 1, wherein the average size (b) is 2 μm or more.

4. The bonding wire for a semiconductor device according to claim 1, wherein a relationship between an average size (c) of the crystal grains in the skin layer on the wire surface along a wire axis direction and an average size (d) of the crystal grains in the core material along the wire axis direction on an axial cross section, said axial cross section being a cross section including the wire axis along a longitudinal direction, satisfies an inequality of $d/c \geqq 1.2$.

5. The bonding wire for a semiconductor device according to claim 1, wherein a relationship between a hardness SH on a surface of the skin layer and a hardness CH on a cross section of the core material satisfies an inequality of $SH/CH \geqq 1.3$.

6. The bonding wire for a semiconductor device according to claim 1, wherein the skin layer has a thickness of 0.005 to 0.3 μm.

7. The bonding wire for a semiconductor device according to claim 1, further comprising an intermediate metal layer between the skin layer and the core material, said intermediate metal layer being made of a component different from the main components constituting the skin layer and the core material.

8. The bonding wire for a semiconductor device according to claim 1, further comprising a diffusion layer having a concentration gradient between the skin layer and the core material.

9. The bonding wire for a semiconductor device according to claim 1, wherein the main component constituting the core material is Cu, and the core material contains at least one of In, Ca, B, Pd, Bi, Zr, Ag, and P in a range of 5 to 300 ppm.

10. The bonding wire for a semiconductor device according to claim 1, wherein the main component constituting the core material is Cu, the core material contains Pd in a range of 5 to 10000 ppm, and the main component constituting the skin layer is Pd or Ag.

11. The bonding wire for a semiconductor device according to claim 1, wherein the main component constituting the core material is Au, and the core material contains at least one of Be, Ca, Ni, Pd, and Pt in a range of 5 to 9500 ppm.

* * * * *